US008421029B1

(12) United States Patent
Ren et al.

(10) Patent No.: US 8,421,029 B1
(45) Date of Patent: Apr. 16, 2013

(54) WIEN FILTER WITH REDUCED FIELD LEAKAGE

(75) Inventors: Weiming Ren, San Jose, CA (US); Xuedong Liu, San Jose, CA (US); Zhongwei Chen, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 0 days.

(21) Appl. No.: 13/298,651

(22) Filed: Nov. 17, 2011

(51) Int. Cl.
*H01J 1/50* (2006.01)
(52) U.S. Cl.
USPC ............................ 250/396 ML; 250/396 R
(58) Field of Classification Search .............. 250/396 R, 250/396 ML
See application file for complete search history.

(56) References Cited

U.S. PATENT DOCUMENTS 6,844,548 B2   1/2005   Lopez et al.

OTHER PUBLICATIONS

U.S. Appl. No. 131292,455, filed Nov. 9, 2011 Chen et al.
Tian-Tong Tang, "Aberration Analysis of a Crossed-field Analyzer", Optik, pp. 51-56, 1986,Wissenschaftliche Verlagsgesellschaft mbH, Stuttgart.

*Primary Examiner* — Michael Maskell
(74) *Attorney, Agent, or Firm* — WPAT PC; Justin King

(57) ABSTRACT

This invention provides a design of Wien filter for satisfying Wien Condition so as to ensure the Wien filter's performance. At first, to minimize the magnetic flux leaking out of the Wien filter, the invention proposes three measures to form a magnetic circuit to cover the magnetic device of a Wien filter respectively. The measures especially benefit a Wien filter acting as beam separator or Monochromator in a high resolution SEM. Secondly, based on the Wien filter proposed in cross-reference, several ways are provided for reducing the dissatisfaction of Wien Condition within the Wien filter, which especially modify either or both of the distribution shapes of the on-axis electric and magnetic dipole fields at two ends of the Wien filter. These ways provide more flexibility to reduce the dissatisfaction of Wien Condition in a Wien filter to a given degree at a reasonable manufacturing cost.

39 Claims, 17 Drawing Sheets

WIEN FILTER WITH REDUCED FIELD LEAKAGE

CROSS REFERENCE TO RELATED APPLICATIONS

This application is related to co-pending U.S. application Ser. No. 13/292,455 entitled to Chen et al. filed Nov. 9, 2011 and entitled "Wien Filter", the entire disclosures of which are incorporated herein by reference.

BACKGROUND OF THE INVENTION

1. Field of the Invention

The present invention relates to a field isolating device for a Wien filter, and more particularly to a design of Wien Filter or called as ExB for all the applications, such as deflecting charged particle beam or separating charged particles in dependence upon mass, or energy, or moving direction thereof in an electron microscope.

2. Description of the Prior Art

Wien filter is known for its capability to separate charged particles in dependence upon mass, or energy, or moving direction thereof. It is based on the principle that the magnetic force of a magnetic field acting on a charged particle depends on the velocity vector thereof, but the electric force of an electric field acting on a charged particle does not.

Concretely speaking, a Wien filter comprises an electric deflector and a magnetic deflector, both of which share a common straight optical axis. The electric dipole field $E_1$ and the magnetic dipole field $B_1$ respectively generated by the electric and magnetic deflectors are perpendicular to each other, and superimposed along and perpendicular to the common straight optical axis. When a particle enters the Wien filter along the optical axis, if the vector directions of the electric and magnetic fields $E_1$ and $B_1$ and the particle velocity $v$ obey the right-hand rule, the electric force and magnetic force acting on the particle will be opposite to each other and perpendicular to the moving direction of the particle, hence generating a total force as shown in Equation (1.1).

$$F = q \cdot (E_1 - v \cdot B_1) \quad (1.1)$$

Furthermore, if the magnitudes of the foregoing three vectors meet a specific condition which is called as Wien Condition and shown in Equation (1.2), the net force exerted on the particle will be zero, thereby not changing the moving of the particle. Any other particle, different from the particle in velocity vector, will receive a non-zero net force, and thereby being deflected away from its original moving direction.

$$E_1 - v \cdot B_1 = 0 \quad (1.2)$$

Considering the relationship of velocity $v$, mass $m$ and kinetic energy $V$ of a particle, which is shown in Equation (1.3), obviously, Wien Condition can be satisfied for particles having a given ratio between mass and energy and a given moving direction. Therefore many applications of Wien filter have been proposed for separating particles identical in charge and energy but different in mass (such as a mass filter), or particles identical in charge and mass but different in kinetic energy (such as an energy filter), or two charged particle beams both having particles identical in mass and charge but traveling in mutually opposite directions, such as primary beam and secondary beam in SEM.

$$v = \sqrt{\frac{2 \cdot V}{m}} \quad (1.3)$$

In most of those applications, Wien filter is employed in an imaging system, wherein the straight optical axes of the Wien filter and the imaging system coincide. If the Wien Condition is not satisfied wherever the particles in the imaging beam will travel through, the additional aberrations will be added to the imaging beam due to the undesired particle deflection. Therefore, constraining or even eliminating the adverse impact of Wien filter on imaging quality is a prerequisite for employing a Wien filter in such a case, and meeting Wien Condition to the maximum extent possible is the essential requirement for practically constructing a Wien Filter. Practically meeting Wien Condition can be considered in terms of the on-axis area (on the optical axis) and the off-axis area (off the optical axis).

At first, in the on-axis area, the velocities of on-axis particles are constant because there is no axial acceleration or deceleration field within Wien filter. Therefore Equation (1.2) requires the on-axis electric and magnetic fields $E_1$ and $B_1$ have a same distribution shape. If it is not true, the net forces exerted on the on-axis charged particles will not be zero, thereby gradually deflecting the particles away from the optical axis and generating off-axis aberrations. The better the two fields match each other in field distribution shape, the smaller the net forces will be, thereby appearing the less moving-direction deviation from the optical axis and the off-axis aberrations.

Secondly, in the off-axis area, due to a potential change in the electric field direction, an off-axis particle in the imaging beam will have a velocity not only different from the given velocity of the on-axis particles but also dependent on its off-axis shift. Therefore, if the magnitudes of the electric and magnetic dipole fields have a uniform distribution in the electric field direction, the Wien Condition can not be satisfied over the entire off-axis area, thereby leading to a focusing effect in this direction and hence adding astigmatism to the imaging particle beam.

A number of methods for practically constructing a Wien filter have been proposed by taking account of the foregoing issues. An effective and advantageous way is to construct either or both of the electric and magnetic deflectors with a multi-pole structure. The multi-pole structure can generate a dipole field and a quadrupole field simultaneously, which enables the astigmatism being compensated where it occurs. Furthermore, the two fields can be electrically adjusted separately. Therefore such a Wien filter is easily adjusted to match the changeable operation conditions of the imaging system which the Wien filter is applied to. To obtain a good fields-match of the electric and magnetic dipole fields in field distribution shape, the electric and magnetic deflectors are even constructed to have a common multi-pole structure, wherein all the magnetic pole-pieces act as electrodes as well, such as the 8-pole type Wien filter proposed by Tian-Tong Tang (Optik, 74, No. 2, 1986, P51-56). This design fundamentally ensures the fields-match is good inside the electric and magnetic deflectors.

However, for a Wien filter having multi-pole structure, an issue related to higher order harmonics appears. When a multi-pole device is excited to generate a dipole field, it actually generates a field which not only comprises a dipole field or called as $1^{st}$ order harmonic but also many higher order harmonics which are undesired due to incurring aberrations. To minimize the first higher order harmonic, i.e., $3^{rd}$ order harmonic, a number of measures on arranging and exciting the multiple magnetic pole-pieces or electrodes have been proposed. For the Wien filters whose electric and magnetic deflectors have a common multi-pole structure, Lopez and Tsuno proposed a 12-pole structure with a 12-fold rotational symmetry in U.S. Pat. No. 6,844,548. For the Wien filters in which the electric and magnetic deflectors are separate in structure, Chen et al. file a U.S. patent application Ser. No. 13/292,455, filed Nov. 9, 2011 to provide a solution which is shown in FIGS. 1(a)-1(d). In this Wien filter 100 which has an optical axis on Z-axis, the cylindrical 12-electrode electric device 30 and the cylindrical 4-coil magnetic device 40 act as an electric deflector and a magnetic deflector respectively. The special 8-fold symmetry in geometry as shown in FIG. 1(a) and the special 2-fold symmetry in potential distribution of the device 30 as shown in FIG. 1(c) ensure it generates an electric dipole field $E_1$ in X direction and limits the $3^{rd}$ order harmonic negligibly small. The special 4-fold symmetry in geometry as shown in FIG. 1(a) and the combination of a 2-fold symmetry and a 2-fold anti-symmetry in magnetomotive force distribution of the device 40 as shown in FIG. 1(c) ensure it generates a magnetic dipole field $B_1$ in Y direction and limits the $3^{rd}$ order harmonic negligibly small.

For the applications of Wien filter in an imaging system having a high imaging resolution, such as beam separator and Monochromator in a high resolution scanning electron microscope (SEM), the foregoing solutions are not enough. Meeting Wien Condition more strictly becomes more necessary. Among all the necessary improvements, the deviation of the fields-match from a perfect match in the fringe areas on both sides of a Wien filter deserves the first attention. The deviation is simply called as the fields-mismatch and expressed by the difference between the normalized on-axis magnetic and electric fields $B_1$ and $E_1$ hereafter.

In U.S. patent application Ser. No. 13/292,455, filed Nov. 9, 2011, Chen et al. further propose a measure to reduce the fields-mismatch in the fringe areas of the Wien filter, which is shown in FIG. 1(b). The two conical end portions of the electric device 30 and two field-terminating plates 61 and 62 ensure the fields-mismatch small within the Wien filter 100. The two field-terminating plates 61 and 62 are made of a material of both electric and magnetic conductor. The higher their permeability u21 and u22 are, the smaller the fields-mismatch in the two fringe areas 21 and 22 will be. FIG. 1(d) shows the fields-mismatch when u21 and u22 both are same and equal to 1000 and 10000 respectively. Increasing permeability u21 and u22 effectively reduces the fields-mismatch in the fringe areas 21 and 22, i.e. the areas at entrance and exit ends of the Wien filter. For the fringe areas 23 and 24 outside but close to the Wien filter, the fields-mismatch is still large and almost not reduced. The concrete analysis shows the fields-mismatch in the fringe areas 23 and 24 comes from the non-zero magnetic dipole field in these areas. For the sake of the clarity, 21 and 22 are called as the near fringe areas, and 23 and 24 as the far fringe areas. However, the fields-mismatch in the far fringe areas 23 and 24 will gradually deflect the particles away from the optical axis. For the imaging beam, the deflection accumulation happened before and after the Wien filter will make the beam enter the Wien filter and the other following imaging elements not along the optical axis, and it may eventually result in a non-negligible deviation of the landing position and large off-axis aberrations of the imaging beam on the destination plane.

Accordingly, a field-isolating device for a Wien filter, which can reduce or even eliminate the magnetic field leaking out of a Wien filter onto the far fringe areas thereof, is demanded by many applications of Wien filter, particularly for a charged particle apparatus using Wien filter in its imaging system such as a SEM. In addition, as mentioned in the cross-reference, a new design of Wien filter, which has a compact and efficient structure that can have much flexibility to meet the Wien Condition as much as possible within the Wien filter, is also necessary for the foregoing applications.

SUMMARY OF THE INVENTION

At first this invention will provide several field-isolating measures for reducing the fields-mismatch in the far fringe areas of a Wien filter, which are especially useful for the Wien filter used in an imaging system, such as the Wien filter acting as monochromator or beam separator in a high resolution SEM. In such an application of Wien filter, the adverse impact on imaging quality due to the electric and magnetic fields leaking out of the Wien filter must be constricted under a certain level. Accordingly, each of the measures specially forms a magnetic circuit to cover the magnetic deflector in a Wien filter, so as to suppress the magnetic flux leaking out of the Wien filter as much as possible.

Secondly, this invention will provide several designs of Wien filter, each of which is especially suitable to be employed in an imaging system with high resolution, such as being taken as a monochromator or beam separator in SEM. Such an application of Wien filter requires a strict conforming to Wien Condition so as to minimize the adverse impact of the Wien filter on the imaging quality. Accordingly, the designs of Wien filter are based on the foregoing field-isolating measures, and the elementary electric and magnetic devices proposed by Chen et al. in U.S. patent application Ser. No. 13/292,455, filed on Nov. 9, 2011. The designs provide more flexibility to meet the Wien Condition as much as possible both within the Wien filter and in the fringe areas thereof.

Accordingly, the invention therefore provides a fielding-isolating device for a Wien filter. The field-isolating device comprises two field-terminating plates and one field-terminating tube. The two field-terminating plates are perpendicular to an optical axis of the Wien filter and sandwich the Wien filter with two axial gaps. Each of the two field-terminating plates is made of a material of both electric and magnetic conductor and has an opening aligned with the optical axis of the Wien filter and for particles passing through. The field-terminating tube is parallel to the optical axis of the Wien filter and encloses the Wien filter with a radial gap, wherein the tube is made of a material of magnetic conductor. The two field-terminating plates and field-terminating tube are configured to make an electric dipole field and a magnetic dipole field leaking out of the Wien filter vanish away rapidly outside the field-isolating device.

The field-isolating device may further comprise two field-shielding plates which are perpendicular to the optical axis of the Wien filter and sandwich the two field-terminating plates with two axial gaps. Each of the two field-shielding plates is made of a material of both electric and magnetic conductor and has an opening aligned with the optical axis of the Wien filter and for particles passing through. The two field-terminating plates, field-terminating tube and two field-shielding plates together are configured to make the electric dipole field and magnetic dipole field leaking out of the Wien filter vanish away more rapidly outside the field-isolating device.

The field-isolating device may further comprise a field-shielding tube which is parallel to the optical axis of the Wien filter and encloses the field-terminating tube with a radial gap, wherein the field-shielding tube is made of a material of magnetic conductor. The two field-terminating plates, field-terminating tube, two field-shielding plates, and field-shielding tube together are configured to make the electric dipole field and magnetic dipole field leaking out of the Wien filter vanish away much more rapidly outside the field-isolating device.

The two field-terminating plates and the two field-shielding plates can be configured and set at a potential so as not to generate acceleration or deceleration field along the optical axis of the Wien filter inside the field-isolating device, or to generate no electric round lens field inside the field-isolating device. Radial outer dimensions of the two field-shielding plates are preferred equal to or larger than radial outer dimensions of the two field-terminating plates and field-shielding tube, and dimensions of the openings of the two field-terminating plates and two field-shielding plates are preferred equal to or smaller than radial inner dimensions of the Wien filter.

A first gap can be between the field-terminating tube and each of the two field-terminating plates. A second gap can be between the field-shielding tube and each of the two field-terminating plates. A third gap can be between the field-shielding tube and each of the two field-shielding plates. A fourth gap can be between the field-terminating tube and each of the two field-shielding plates.

The present invention therefore provides an electric device which comprises twelve electrodes and two electric field-terminating plates. Inner ends of the twelve electrodes configure a cylindrical through hole and an 8-fold symmetry, and twelve through slits separate the twelve electrodes respectively and parallel to a central axis of the hole. The central axis is an optical axis of the electric device. The twelve electrodes are excited to generate an electric dipole field in a direction perpendicular to the optical axis. The two electric field-terminating plates are perpendicular to the optical axis and sandwich the twelve electrodes with two axial gaps, such that the electric dipole field along the optical axis vanishes away rapidly outside the electric device. Each of the two electric field-terminating plates is made of a material of electric conductor, and has an opening aligned with the optical axis of the electric device and for particle passing through. Each of the twelve through slits has a central plane containing the optical axis. A $1^{st}$ electrode, a $2^{nd}$ electrode, a $3^{rd}$ electrode, a $4^{th}$ electrode, a $5^{th}$ electrode, a $6^{th}$ electrode, a $7^{th}$ electrode, an $8^{th}$ electrode, a $9^{th}$ electrode, a $10^{th}$ electrode, an $11^{th}$ electrode and a $12^{th}$ electrode of the twelve electrodes are configured in a rotation sequence.

The 8-fold symmetry of the electric device has four planes of symmetry, wherein a first and a third planes of symmetry of the four planes of symmetry are perpendicular to each other, a second and a fourth planes of symmetry of the four planes of symmetry are perpendicular to each other, an angle between the first and the second planes of symmetry is 45°, and each of the four planes contains the optical axis. The first plane of symmetry bisects the inner ends of the $1^{st}$ and $7^{th}$ electrodes, the second plane of symmetry bisects the through slit between the $2^{nd}$ and $3^{rd}$ electrodes and the through slit between the $8^{th}$ and $9^{th}$ electrodes, the third plane of symmetry bisects the inner ends of the $4^{th}$ and $10^{th}$ electrodes, and the fourth plane of symmetry bisects the through slit between the $5^{th}$ and $6^{th}$ electrodes and the through slit between the $11^{th}$ and $12^{th}$ electrodes. An angle between the first plane of symmetry and the central plane of the through slit between the $1^{st}$ and $2^{nd}$ electrodes is preferred about 25°. Arc angles of inner sides of the twelve through slits, in any sectional plane perpendicular to the optical axis, are preferred equal to each other and about 3°.

In the electric device, the $5^{th}$, $7^{th}$, and $9^{th}$ electrodes can be set at a first potential, the $1^{st}$, $3^{rd}$, and $11^{th}$ electrodes are set at a second potential, the $8^{th}$, $10^{th}$, and $12^{th}$ electrodes are set at a third potential, and the $2^{nd}$, $4^{th}$, and $6^{th}$ electrodes are set at a fourth potential. An average of the first and second potentials is equal to an average of the third and fourth potentials, and the two electric field-terminating plates are set at the average potential of the first and second potentials. Potentials of the $1^{st}$, $2^{nd}$, $6^{th}$, $7^{th}$, $8^{th}$, and $12^{th}$ electrodes can be changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

In the electric device, outer radial dimensions of the electrodes are preferred equal to or small than outer radial dimensions of the two electric field-terminating plates, and a diameter of the cylindrical through hole is preferred equal to or larger than radial dimensions of the openings of the two electric field-terminating plates.

The present invention therefore provides a magnetic device which comprises a cylindrical magnetic core with a cylindrical through hole, four coils and two magnetic field-terminating plates. A central axis of the hole is an optical axis of the magnetic device. The four coils respectively wind around an inner sidewall and an outer sidewall of the magnetic core and are parallel to the optical axis. A $1^{st}$ coil, a $2^{nd}$ coil, a $3^{rd}$ coil, and a $4^{th}$ coil of the four coils are configured in a rotation sequence. The $1^{st}$ and $3^{rd}$ coils are bisected by a common central plane, the $2^{nd}$ and $4^{th}$ coils are bisected by the other common central plane, and both of the two common central planes contain the optical axis. The four coils are excited to generate a magnetic dipole filed in a direction perpendicular to the optical axis. The two magnetic field-terminating plates are perpendicular to the optical axis of the magnetic device and sandwich the cylindrical magnetic core with two axial gaps, such that the magnetic dipole field along the optical axis of the magnetic device vanishes away rapidly outside the magnetic device. Each of the two magnetic field-terminating plates is made of a material of magnetic conductor, and has an opening aligned with the optical axis of the magnetic device and for particles passing through. A first plane and a second plane respectively bisect two adjacent angles between the two common central planes, and a first direction and a second direction are both perpendicular to the optical axis and respectively parallel to the first and the second planes.

In the magnetic device, the cylindrical through hole is preferred coaxial with an outline of the cylindrical magnetic core, and one of the two adjacent angles between the two common central planes is preferred about 120°. Magnetomotive forces of the four coils are preferred equal in magnitude, and the electric current directions thereof are symmetric about the first plane and anti-symmetric about the second plane. An outer diameter of the magnetic core is preferred equal to or small than outer radial dimensions of the two magnetic field-terminating plates, and a diameter of the cylindrical through hole is preferred equal to or larger than radial dimensions of the openings of the two magnetic field-terminating plates.

The magnetic device may further comprise a magnetic field-terminating tube being parallel to the optical axis and enclosing the magnetic core with a radial gap, such that the magnetic dipole field along the optical axis of the magnetic device vanishes away more rapidly outside the magnetic device. The tube is made of a material of magnetic conductor.

The present invention therefore provides a first embodiment of Wien filter which comprises the foregoing magnetic device and the foregoing electric device. The twelve electrodes of the electric device are inside the cylindrical through hole of the magnetic core of the magnetic device. The optical axis of the electric device, coincident with the optical axis of the magnetic device, is an optical axis of the Wien filter. The first and the second directions of the magnetic device are a first direction and a second direction of the Wien filter respectively. The electric device generates an electric dipole field in the first direction of the Wien filter, and the magnetic device generates a magnetic dipole field in the second direction of the Wien filter. The electric field-terminating plate of the electric device and the magnetic field-terminating plate of the magnetic device on the same side of the Wien filter are a same field-terminating plate which is made of a material of both electric and magnetic conductor.

In the first embodiment of Wien filter, an outline of the twelve electrodes of the electric device is preferred to be configured to be cylindrical and coaxial with the cylindrical through hole thereof, and the outline of the cylindrical magnetic core of the magnetic device is preferred to be configured coaxial with the cylindrical through hole thereof. The outer diameter of the magnetic core of the magnetic device is preferred equal to or small than outer radial dimensions of the two field-terminating plates, and the diameter of the cylindrical through hole of the electric device is preferred equal to or larger than radial dimensions of the openings of the two field-terminating plates.

In the first embodiment of Wien filter, the first plane of symmetry in the electric device is preferred to coincide with the first plane of the magnetic device. Accordingly, the $5^{th}$, $7^{th}$, and $9^{th}$ electrodes can be set at a first potential, the $1^{st}$, $3^{rd}$, and $11^{th}$ electrodes are set at a second potential, the $8^{th}$, $10^{th}$, $12^{th}$, $2^{nd}$, $4^{th}$, $6^{th}$ electrodes and two field-terminating plates are set at an average potential of the first and second potentials. The average of the first and second potentials is preferred equal to zero potential. Potentials of the $1^{st}$, $2^{nd}$, $6^{th}$, $7^{th}$, $8^{th}$, and $12^{th}$ electrodes can be changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

For the magnetic device in the first embodiment of Wien filter, the angle between the two common central plates and bisected by the second plane is preferred about 120°, and the magnetomotive forces of the four coils are preferred equal in magnitude and the electric current directions thereof are symmetric about the first plane and anti-symmetric about the second plane. For the electric device in the first embodiment of Wien filter, the angle between the first plane of symmetry and the central plane of the through slit between the $1^{st}$ and $2^{nd}$ electrodes is preferred about 25°, and arc angles of inner sides of the twelve through slits in the any sectional plane perpendicular to the optical axis are preferred equal to each other and about 3°.

A diameter of the cylindrical through hole of the electric device can be smaller at a central portion thereof than at two end portions thereof, such that a distribution shape of the electric dipole field can match a distribution shape of the magnetic dipole field along the optical axis of the first embodiment of Wien filter.

A diameter of the cylindrical through hole of the magnetic device can be larger at a central portion thereof than at two end portions thereof, such that the distribution shape of the magnetic dipole field can match the distribution shape of the electric dipole field along the optical axis of the first embodiment of Wien filter.

A permeability of the magnetic core of the magnetic device can be smaller at a central portion thereof than at two end portions thereof, such that the distribution shape of the magnetic dipole field can match the distribution shape of the electric dipole field along the optical axis of the first embodiment of Wien filter.

Each of two end portions of the cylindrical through hole of the electric device may have a portion of conical shape coaxial with a cylindrical central portion of the through hole, such that the distribution shape of the electric dipole field can match the distribution shape of the magnetic dipole field along the optical axis of the first embodiment of Wien filter.

The first embodiment of Wien filter may further comprise a field-terminating tube being parallel to the optical axis of the Wien filter and enclosing the magnetic core of the magnetic device with a radial gap, such that the magnetic dipole field along the optical axis of the Wien filter vanishes away more rapidly outside the Wien filter. The tube is made of a material of magnetic conductor.

The first embodiment of Wien filter may further comprise two field-shielding plates being perpendicular to the optical axis of the Wien filter and sandwiching the field-terminating plates with two axial gaps, such that the electric and magnetic dipole fields along the optical axis of the Wien filter vanish away more rapidly outside the Wien filter. Each of the two field-shielding plates is made of a material of both electric and magnetic conductor, and has an opening aligned with the optical axis of the Wien filter and for particles passing through.

The first embodiment of Wien filter may further comprise a field-shielding tube being parallel to the optical axis of the Wien filter and enclosing the field-terminating tube with a radial gap, such that the magnetic dipole field along the optical axis of the Wien filter vanishes away more rapidly outside the Wien filter. The tube is made of a material of magnetic conductor.

The present invention therefore further provides a second embodiment of Wien filter which comprises a cylindrical magnetic device, a cylindrical electric device, two field-terminating plates, and a field-terminating tube.

The cylindrical magnetic device includes a cylindrical magnetic core with a first coaxial-cylindrical through hole and four coils. A central axis of the through hole is the optical axis of the magnetic device and the Wien filter. The four coils respectively wind around an inner sidewall and an outer sidewall of the magnetic core and are parallel to the optical axis. The four coils configure a 4-fold symmetry in any sectional plane perpendicular to the optical axis such that a magnetic dipole field can be generated within the magnetic device in a direction perpendicular to the optical axis.

The cylindrical electric device includes twelve electrodes which configure a cylinder with a second coaxial-cylindrical through hole and are inside the first through hole of the magnetic core of the cylindrical magnetic device. A central axis of the second hole is an optical axis of the electric device and coincident with the optical axis of the Wien filter. The twelve electrodes configure an 8-fold symmetry and are sectorial in the any sectional plane perpendicular to the optical axis. Twelve through slits separate the twelve electrodes respectively and are parallel to the optical axis, wherein each of the twelve through slits has a central plane containing the optical axis. The twelve electrodes are excited to generate one electric dipole field within the electric device in a direction perpendicular to the optical axis of the Wien filter and the magnetic dipole field.

The two field-terminating plates are perpendicular to the optical axis of the Wien filter and sandwich the magnetic device and the electric device with two axial gaps respectively, such that the electric dipole field and the magnetic dipole field along the optical axis of the Wien filter vanish away rapidly outside the Wien filter. Each of the two field-terminating plates is made of a material of both electric and magnetic conductor, and has an opening aligned with the optical axis of the Wien filter and for particles passing through.

The field-terminating tube is parallel to the optical axis of the Wien filter and encloses the magnetic device with a radial gap, such that the magnetic dipole field along the optical axis of the Wien filter vanishes away more rapidly outside the Wien filter. The tube is made of a material of magnetic conductor.

Each of two end portions of the second coaxial-cylindrical through hole of the electric device may have a portion of conical shape coaxial with a cylindrical central portion of the second hole, such that a distribution shape of the electric dipole field can match a distribution shape of the magnetic dipole field along the optical axis of the Wien filter.

The second embodiment of Wien filter may further comprise two field-shielding plates being perpendicular to the optical axis of the Wien filter and sandwiching the two field-terminating plates with two axial gaps, such that the electric dipole field and the magnetic dipole field along the optical axis of the Wien filter vanish away more rapidly outside the Wien filter. Each of the two field-shielding plates is made of a material of both electric and magnetic conductor, and has an opening aligned with the optical axis of the Wien filter and for particles passing through.

The second embodiment of Wien filter may further comprise a field-shielding tube being parallel to the optical axis of the Wien filter and enclosing the field-terminating tube with a radial gap, such that the magnetic dipole field along the optical axis of the Wien filter vanishes away more rapidly outside the Wien filter. The tube is made of a material of magnetic conductor.

The present invention therefore provides a third embodiment of Wien filter which comprises an electric device generating an electric dipole field in a direction perpendicular to an optical axis of the Wien filter, a magnetic device generating a magnetic dipole field in a direction perpendicular to the optical axis of the Wien filter and the electric dipole field, two field-terminating plates being perpendicular to the optical axis of the Wien filter and sandwiching the electric device and the magnetic device with two axial gaps respectively, a field-terminating tube being parallel to the optical axis of the Wien filter and enclosing the electric device and the magnetic device with a radial gap respectively, and two field-shielding plates being perpendicular to the optical axis of the Wien filter and sandwiching the two field-terminating plates with two axial gaps. The magnetic dipole field is superimposed onto the electric dipole field. Each of the two field-terminating plates and the two field-shielding plates is made of a material of both electric and magnetic conductor and has an opening aligned with the optical axis of the Wien filter and for particles passing through. The field-terminating tube is made of a material of magnetic conductor. The two field-terminating plates, field-terminating tube, two field-shielding plates are configured to make the electric dipole field and magnetic dipole field along the optical axis of the Wien filter vanish away rapidly outside the Wien filter. The two field-terminating plates and the field-shielding plates are configured and set at a potential so as not to generate acceleration or deceleration field along the optical axis of the Wien filter inside the Wien filter.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

DETAILED DESCRIPTION OF EXAMPLE EMBODIMENTS

Figure 1A:
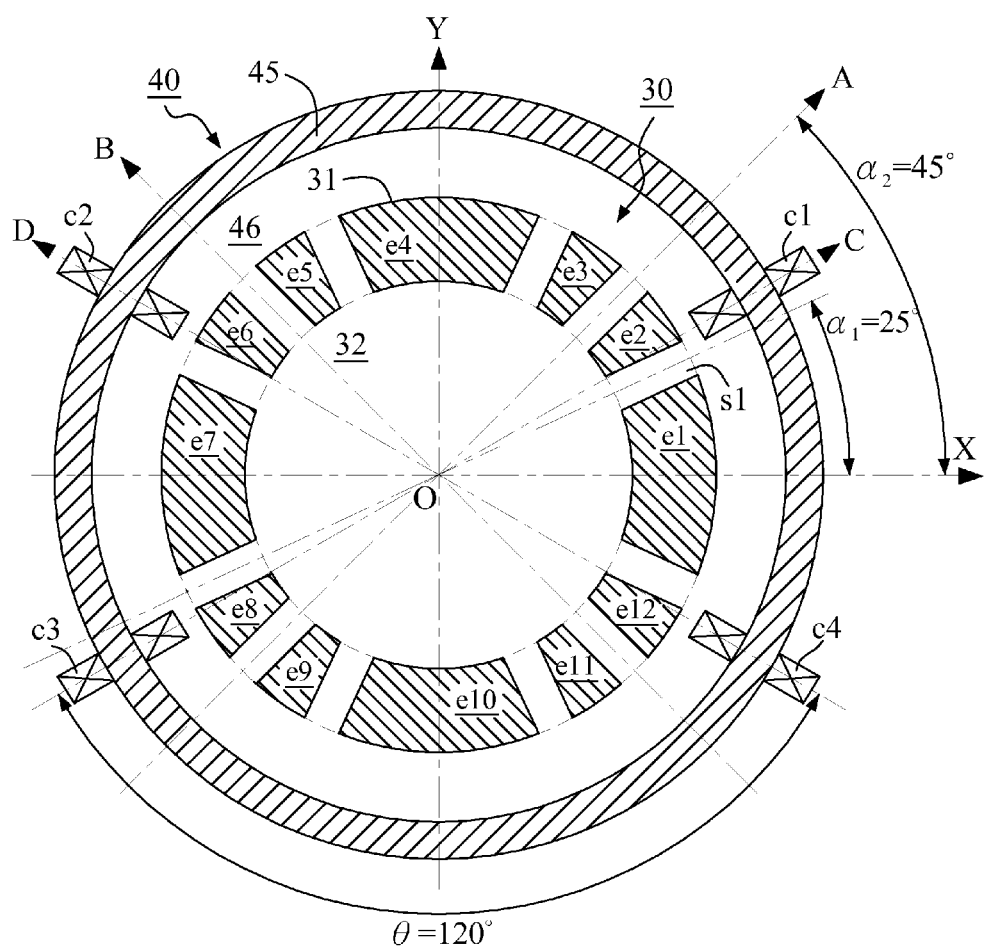
FIGS. 1(a)~1(c) are schematic illustrations of the Wien filter disclosed in the cross-reference.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described. In all the drawings, X, Y and Z axes form Cartesian coordinate, and the electron beam propagates along Z-axis in +Z direction.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, an 8-fold symmetry means an electric device will be symmetrical about four planes which include a first plane, a second plane, a third plane, and a four plane all containing the same axis. The first plane is orthogonal to the third plane while the second plane is orthogonal to the fourth plane, wherein an angle between the first plane and the second plane is 45°. The electric device, in this invention, includes twelve electrodes, and the twelve electrodes hence are symmetrical about the four planes.

In this invention, 4-fold symmetry means positions of four coils of a magnetic device will be symmetrical about two planes which include the first plane and the third plane mentioned above.

In this invention, "axial" means "in the optical axis direction of a Wien filter", while "radial" means "in a direction perpendicular to the optical axis of a Wien filter".

As the description of the prior art, a Wien filter basically provides an electric dipole field $E_1$ and a magnetic dipole field $B_1$ respectively perpendicular to each other and the straight optical axis thereof, and furthermore the two fields and the velocity of each particle traveling through the two fields are required to meet Wien Condition shown in Equation (1.2). For the particles traveling along the optical axis, Wien Condition implies the electric and magnetic fields $E_1$ and $B_1$ must have same distribution shapes, or in other words match each other in distribution shape. Any fields-mismatch will deflect the particles away from the optical axis, consequently resulting in off-axis aberrations and landing position deviation on the destination plane.

Chen et al. propose a configuration of a Wien filter in U.S. patent application Ser. No. 13/292,455, filed Nov. 9, 2011, which can achieve a good match of the electric and magnetic dipole fields in field distribution shape and is shown in FIGS. 1(a)~1(d). The Wien filter 100 shown in FIGS. 1(a)~1(d), comprises an electric device 30 and a magnetic device 40, respectively acting as an electric deflector and a magnetic deflector.

FIG. 1(a) is the view on a sectional plane perpendicular to the optical axis of the Wien filter 100, and the optical axis lies on Z-axis. In FIG. 1(a), the electric device 30 comprises twelve electrodes e1~e12 named in a counterclockwise rotation sequence. The electrode e1 is on the positive X-axis and e1~e12 are respectively named as the $1^{st}$~$12^{th}$ electrodes. The twelve electrodes e1~e12 are separated by twelve through slits s1~s12, which are respectively between every two adjacent electrodes and named in the rotation sequence with respect to electrodes e1~e12 (here only the $1^{st}$ through slit s1 between the electrodes e1 and e2 is indicated for the sake of clarity). The inner ends of the twelve electrodes e1~e12 form a cylindrical through hole 32 and an 8-fold symmetry about four planes XOZ, YOZ, AOZ and BOZ. The plane AOZ is orthogonal to the plane BOZ, and forms an angle equal to 45° with respect to the plane XOZ. The plane XOZ bisects the inner ends of electrodes e1 and e7, the plane YOZ bisects the inner ends of electrodes e4 and e10, the plane AOZ bisects the through slit s2 between the electrodes e2 and e3 and the through slit s8 between the electrodes e8 and e9, and the plane BOZ bisects the through slit s5 between the electrodes e5 and e6 and the through slit s11 between the electrodes e11 and e12. The outer ends of the twelve electrodes is configured to be cylindrical also and coaxial with the cylindrical through hole 32. In such a way, the twelve electrodes e1~e12 form a cylinder 31 with the cylindrical through hole 32 and the twelve through slits s1~s12.

In the electric device 30, the central axis of the through hole 32, coincident with Z-axis, is called as the optical axis of the electric device 30 and the Wien filter 100. Each of the through slits s1~s12 has a central plane containing the Z-axis. The position of each through slit is expressed by the azimuth a of its central line with respect to X-axis and origin O. The azimuths $\alpha_1$~$\alpha_3$ of the s1~s3 through slits have a relationship shown in Equation (2.1), where $\alpha_2$ is equal to 45°. The azimuth $\alpha_1$ is preferred equal to about 25°. The angular width of each through slit is expressed by the circumferential angle or called as arc angle β of its inner arc side with respect to the origin O. Arc angles of inner sides of the through slits s1~s12 are preferred equal to each other and about 3°. The azimuth α and arc angle β of each through slit are constant in any sectional plane perpendicular to the optical axis on Z-axis.

$$\alpha_3 = 2 \cdot \alpha_2 - \alpha_1 \quad (2.1)$$

In FIG. 1(a), the magnetic device 40 comprises four coils c1~c4 named in a counterclockwise rotation sequence and a cylindrical magnetic core 45 with a cylindrical through hole 46. The central axis of the through hole 46, coincident with Z-axis, is called as the optical axis of magnetic device 40. The coils c1~c4 are respectively winded around the inner sidewall and outer sidewall of the magnetic core 45 in $1^{st}$~$4^{th}$ quadrants, and accordingly named as $1^{st}$~$4^{th}$ coils. The coils c1 and c3 are bisected by the common central plane COZ and the coils c2 and c4 are bisected by the common central plane DOZ, and both of the two common central planes contain the optical axis. The coils c1~c4 form a 4-fold symmetry about the plane XOZ and the plane YOZ. That means the plane XOZ and the plane YOZ respectively bisect two adjacent angles between the common central plane COZ and the common central plane DOZ. The angle θ, between the common plane COZ and the common plane DOZ and bisected by the plane YOZ, is preferred equal to about 120°.

Figure 1B:
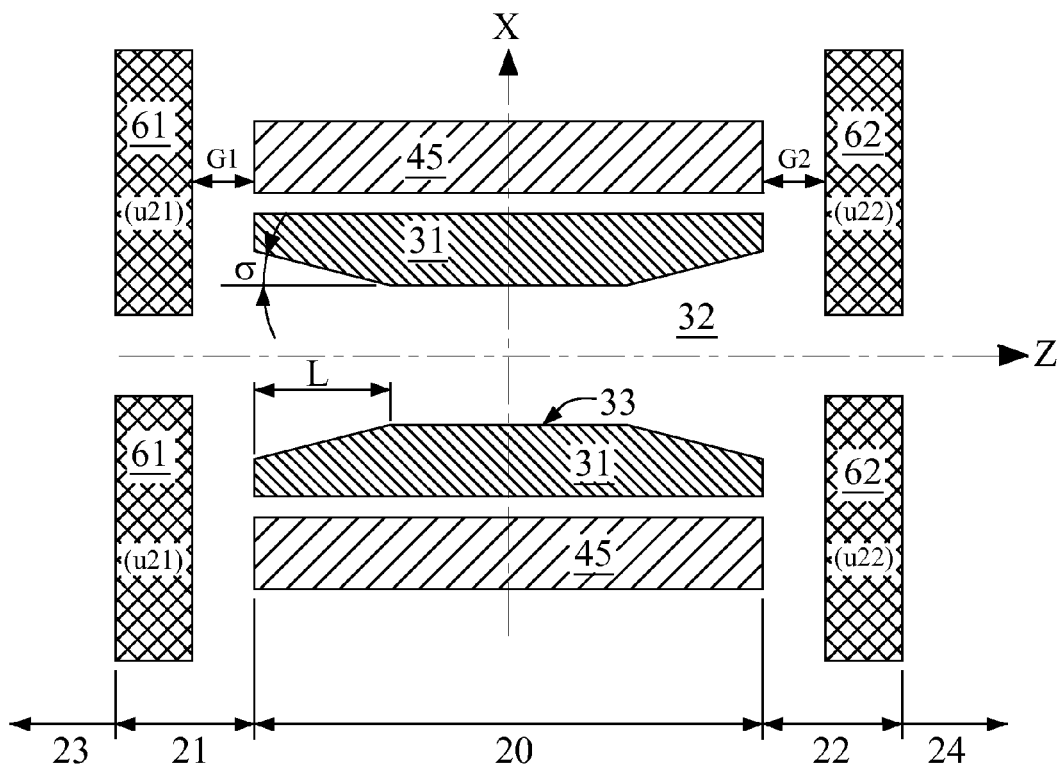

FIG. 1(b) is the view on the sectional plane on the plane XOZ of the Wien filter 100. The two field-terminating plates 61 and 62 are perpendicular to the optical axis and sandwich the electric device 30 and magnetic device 40 with two axial gaps respectively, wherein the two axial gaps on two end sides of the magnetic device 40 are indicated by G1 and G2. The field-terminating plates 61 and 62 are made of a material of both electric and magnetic conductor, and have a permeability u21 and u22 respectively. For electrons passing through the field-terminating plates 61 and 62, each of the two plates 61 and 62 has an opening aligned with Z-axis. The sidewall 33 of the cylindrical through hole 32 formed by twelve electrodes of the electric device 30 is shaped to have two conical end portions which are coaxial with the cylindrical central portion of the hole 32, and can be identical in geometry but opposite to each other.

Figure 1C:
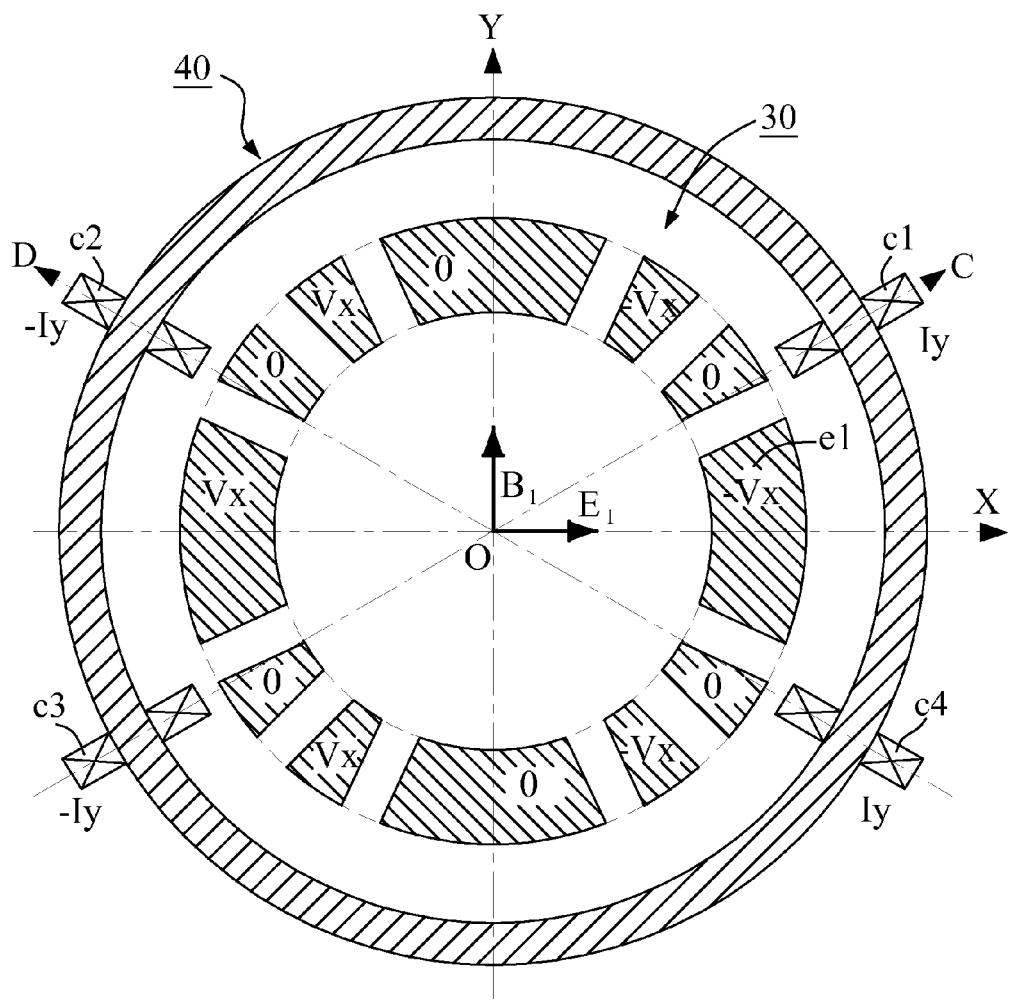

In Wien filter 100, the electric device 30 and magnetic device 40 are respectively excited to generate an electric dipole field $E_1$ in the X direction and a magnetic dipole field $B_1$ in the Y direction. One excitation arrangement is shown in FIG. 1(c). In FIG. 1(c), the electrodes e5, e7 and e9 all are at a first potential which can be equal to a positive potential Vx, the electrodes e1, e3, e11 all are at a second potential which then is equal to the opposite potential −Vx, and all the other electrodes and the field-terminating plates 61 and 62 are at the average potential of the first and the second potentials, which is equal to zero potential here. The undesired $3^{rd}$ order field harmonic $E_3$ appears with the dipole field $E_1$, but is suppressed to be negligibly-small. In FIG. 1(c), the magnetomotive excitations (in ampere-turns) exerted on coils c1~c4 of the magnetic device 40 are equal in magnitude, and the electric current directions thereof are symmetric about the plane XOZ and anti-symmetric about the plane YOZ. For example, please refer to the outer portions of the coils c1~c4, which are on the outer sidewall of the magnetic core 45, the directions of the currents Iy and –Iy of coils c1 and c2 are opposite to each other, thereby being anti-symmetrical about the plane YOZ, while the current directions of the coils c1 and c4 are same, thereby being symmetrical about the plane XOZ. The undesired $3^{rd}$ order field harmonic $B_3$ appears with the dipole field $B_1$, but is suppressed to be negligibly small.

Figure 1D:
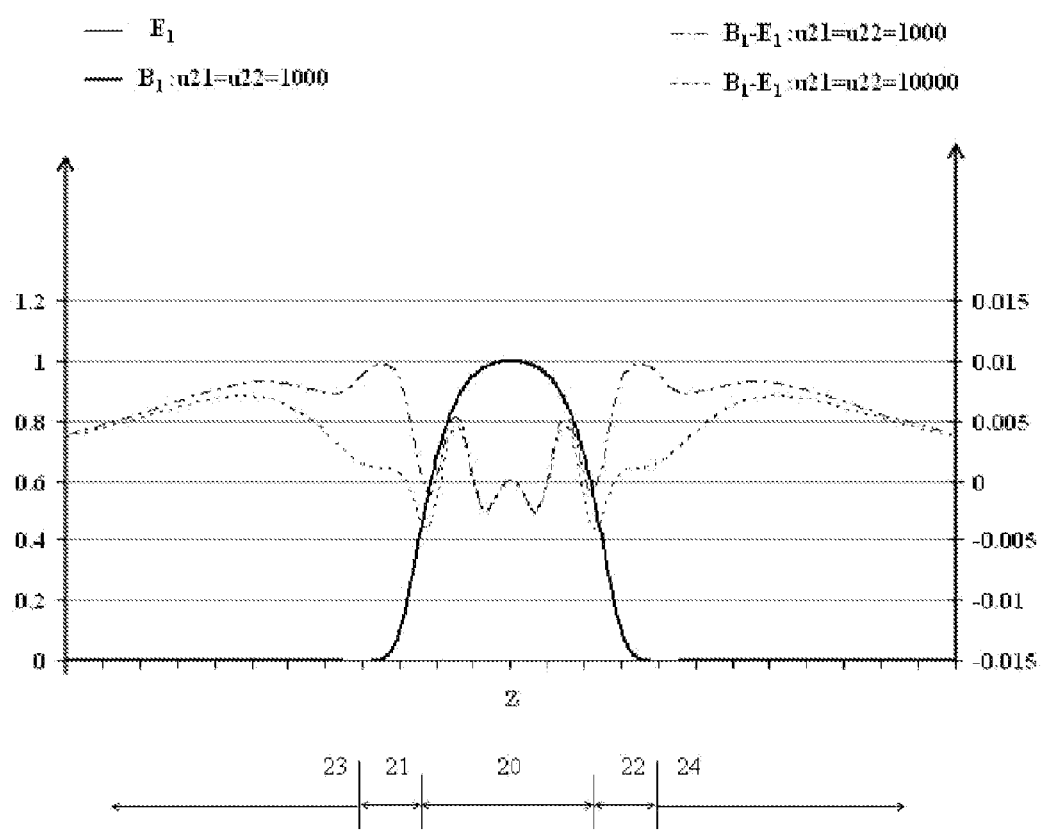
FIG. 1(d) shows a reduction of the fields-mismatch in the near fringe areas of the Wien Filter along the optical axis shown in FIGS. 1(a)~1(c).

FIG. 1(d) shows the difference between the normalized on-axis magnetic and electric fields $B_1$ and $E_1$, wherein the u21 is equal to u22 and the axial gaps G1 and G2 have the same permeability equal to 1. An appropriate combination of the conical angle σ and length L can make the on-axis electric dipole field $E_1$ more match the on-axis magnetic dipole field $B_1$ in field distribution shape. Furthermore, increasing the permeability u21 and u22 of the plates 61 and 62 can reduce the fields-mismatch in the fringe areas, and the reduction in the near fringe areas 21 and 22 is more obviously.

In FIG. 1(d), for the fields-mismatch $B_1$-$E_1$ in the far fringe areas 23 and 24, the reduction due to an increase in the permeability u21 and u22 becomes smaller as more far away from the field-terminating plates 61 and 62. This fields-mismatch will gradually deflect the particles away from the optical axis on Z-axis, and eventually the particles will be not along the optical axis to enter the Wien filter and the following imaging elements of the imaging system which the Wien filter is applied to. For some applications, such a deflection accumulation probably results in large off-axis aberrations which deteriorate the imaging quality to an unacceptable extent and a non-negligible deviation of landing position on the destination imaging plane. Therefore reducing the fields-mismatch outside a Wien filter is one and important object of present invention. In addition, this present invention will provide some measures other than the one shown in FIG. 1(b) to improve the fields-mismatch in the main area 20 and the near fringe areas 21 and 22. Detailed description and mechanism of the embodiments of the present invention are described next.

The concrete analysis of the fields-mismatch $B_1$-$E_1$ in FIG. 1(d) shows the fields-mismatch in the far fringe areas 23 and 24 comes from the magnetic dipole field leaking out of the Wien filter 100 to these areas. For this reason, the invention provides some field-isolating measures to specially form a magnetic circuit to suppress the magnetic flux leaking out of the Wien filter to a large extent. The field-isolating measures are respectively shown in FIG. 2(a), FIG. 3(a) and FIGS. 4(a)~4(c), while the reduction of the fields-mismatch by these measures are respectively shown in FIG. 2(b), FIG. 3(b), FIG. 5(a) and FIG. 5(b). Here the Wien filter 100 is taken as an example to show how the measures are implemented. However, these field-isolating measures can be applied to all other Wien filters also.

Figure 2A:
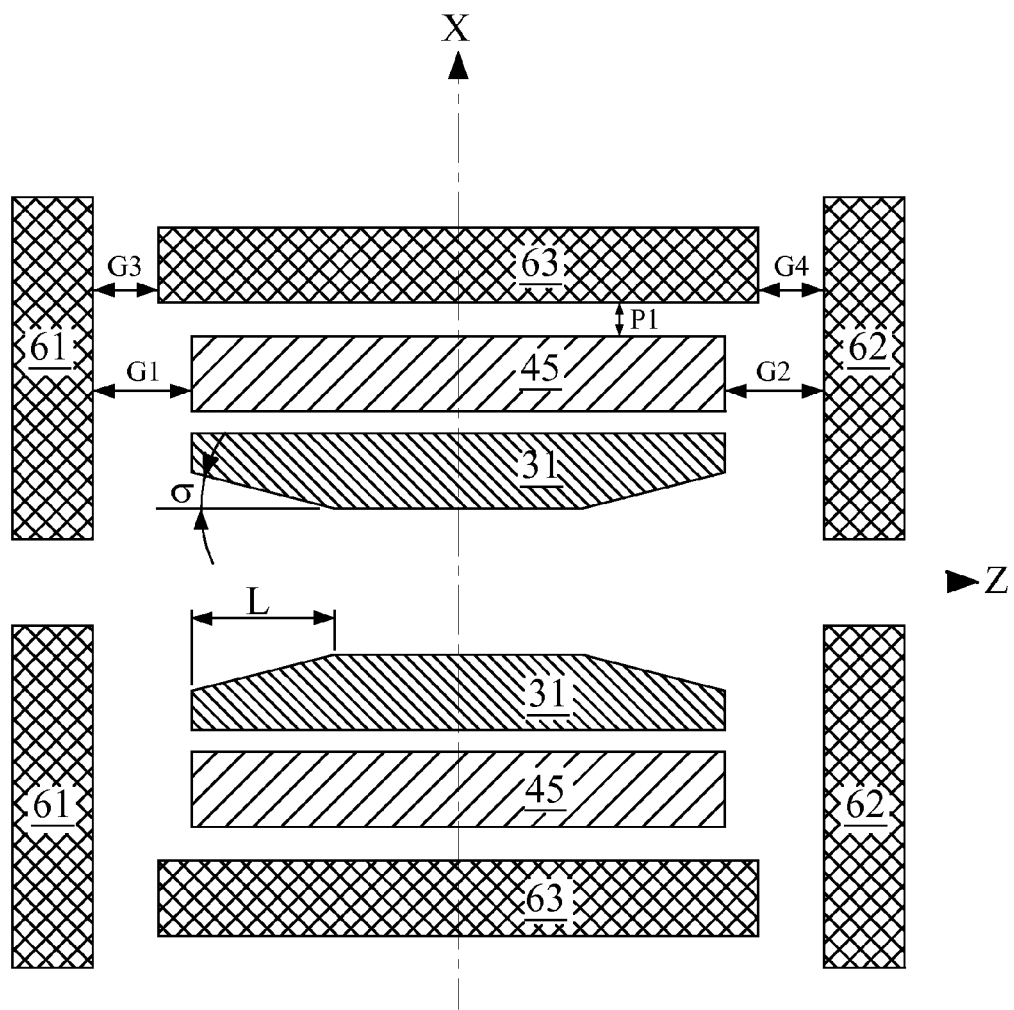
FIG. 2(a) is a schematic illustration of the Wien Filter shown in FIGS. 1(a)~1(c) and a field-isolating device in accordance with a first embodiment of the present invention.

The first field-isolating measure comprises two field-terminating plates and a field-terminating tube, which are configured to cover the Wien filter. Each of the two field-terminating plates is perpendicular to the optical axis of the Wien filter, has an opening aligned with the optical axis of the Wien filter and for particles passing through, and is made of a material of both electric and magnetic conductor. Both of the two field-terminating plates sandwich the Wien filter with two axial gaps. The field-terminating tube is made of a material of magnetic conductor, in parallel to the optical axis of the Wien filter, and encompasses the Wien filter with a radial gap. The radial gap and the two axial gaps respectively can be filled with a material having permeability much lower than that of the entities forming that gap (this situation is called as weakly-magnetic conductor in this invention hereafter) but most preferred vacuum or filled with a material of non-magnetic conductor. One embodiment of the first field-isolating measure is shown in FIG. 2(a) as the first embodiment of the invention. Because the Wien filter 100 already has two field-terminating plates 61 and 62 which can also act as the two field-terminating plates of the first field-terminating measure, consequently only the field-terminating tube 63 is added to the Wien filter 100 in this case. For the sake of clarity, the whole device including the Wien filter 100 and the first field-isolating measure is named as 200 in FIG. 2(a). FIG. 2(a) is the view on the sectional plane on the plane XOZ. The field-terminating tube 63 encompasses the magnetic core 45 of the magnetic device 40 of Wien filter 100 with a radial gap P1 and in parallel to the optical axis on Z-axis, and made of a material of magnetic conductor. The field-terminating plates 61 and 62 sandwich the magnetic core 45 with two axial gaps G1 and G2. The field-terminating tube 63 is preferred to have radial outer dimensions equal to or smaller than that of the plates 61 and 62, and furthermore be sandwiched by the two field-terminating plates 61 and 62 with two axial gaps G3 and G4. All the axial gaps G1~G4 and the radial gap P1 respectively can be filled with a material of weakly-magnetic conductor but most preferred vacuum or filled with a material of non-magnetic conductor. Furthermore, the axial gaps G3 and G4 are preferred not larger than the axial gaps G1 and G2 respectively.

Figure 2B:
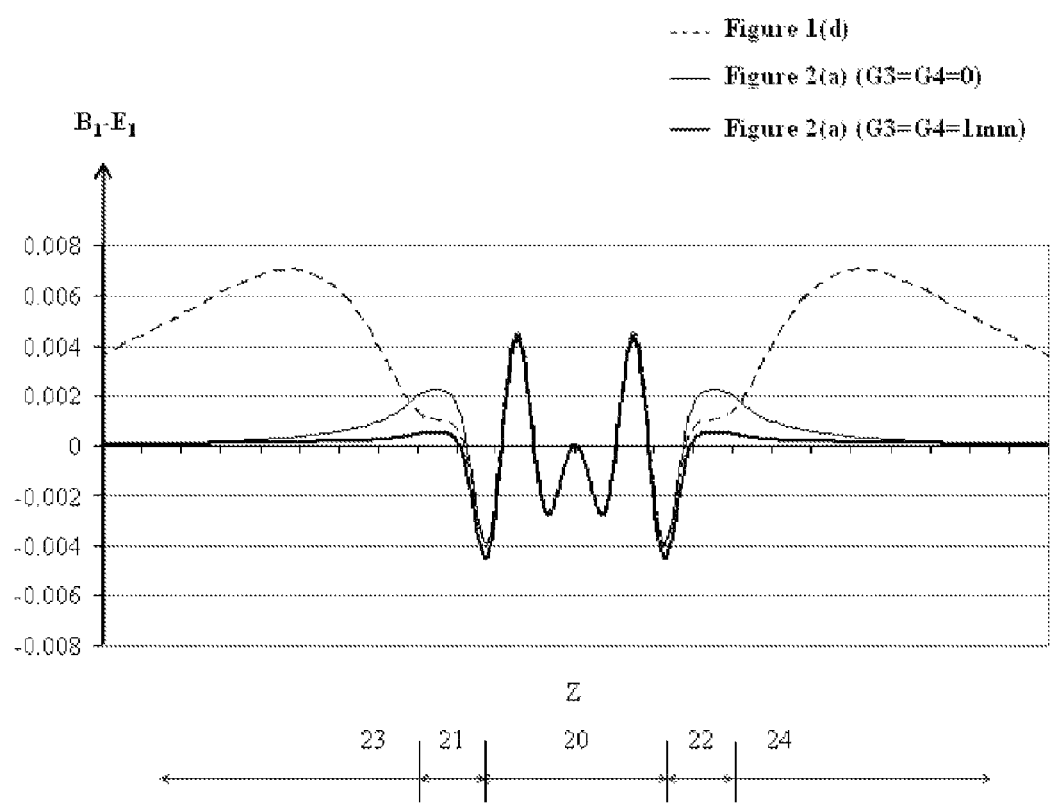
FIG. 2(b) shows a reduction of the fields-mismatch in the far fringe areas of the Wien filter along the optical axis shown in FIG. 2(a).

The reduction of the fields-mismatch in the first embodiment is shown in FIG. 2(b) in comparison with the fields-mismatch shown in FIG. 1(d), wherein the plates 61 and 62 and the tube 63 have the same radial outer dimensions and the same permeability equal to 10000. In FIG. 2(b), the slim dash line is also the slim dash line in FIG. 1(d), the slim solid line is the fields-mismatch when G3=G4=0, and the bold solid line is the fields-mismatch when G3 and G4 both are equal to 1 mm in length, and 1 in permeability. At first, the addition of the field-terminating tube 63 to the magnetic circuit effectively constrains the magnetic flux out of the Wien filter, thereby dramatically reducing the fields-mismatch $B_1$-$E_1$ in the areas outside the plates 61 and 62, i.e. the far fringe areas 23 and 24. In other words, the field-terminating tube makes the magnetic dipole field leaking out of the Wien filter vanish away rapidly as far from the Wien filter. However, the connection of the plates 61 and 62 and the tube 63 increases the magnetic dipole field in the near fringe areas 21 and 22 when G3=G4=0, consequently resulting in an increase of the fields-mismatch in these areas. Secondly, the addition of the non-magnetic gaps G3 and G4 to the magnetic circuit further effectively suppresses the magnetic dipole field in the near fringe areas 21 and 22 and the far fringe areas 23 and 24 simultaneously, thereby further reducing the fields-mismatch in all the fringe areas. For the applications which can accept a Wien filter with large radial outer dimensions, the field-terminating plates 61 and 62 are preferred to have radial outer dimensions much larger than that of the field-terminating tube 63.

Figure 3A:
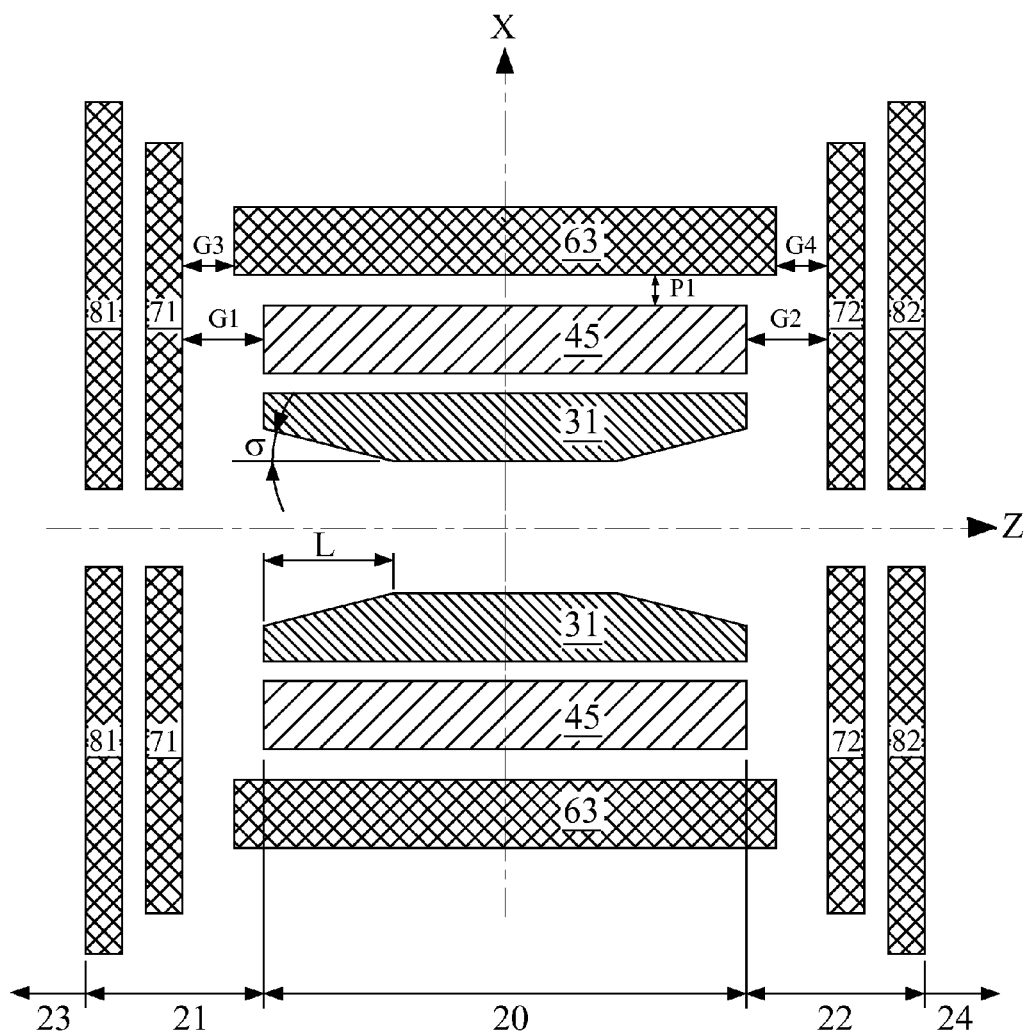
FIG. 3(a) is a schematic illustration of the Wien filter shown in FIGS. 1(a)~1(c) and a field-isolating device in accordance with a second embodiment of the present invention.

The second field-isolating measure comprises the first field-isolating measure and two field-shielding plates which are respectively on the entrance and exit sides of the first field-isolating measure. Each of the two field-shielding plates is perpendicular to the optical axis of the Wien filter, has an opening aligned with the optical axis of the Wien filter and for particles passing through, and is made of a material of both electric and magnetic conductor. Both of the two field-shielding plates sandwich the two field-terminating plates with two axial gaps. Similarly to the first field-isolating measure, the two axial gaps respectively can be filled with a material of weakly-magnetic conductor but most preferred vacuum or filled with a material of non-magnetic conductor. One embodiment of the second field-isolating measure is shown in FIG. 3(a) as a second embodiment of this invention. In FIG. 3(a), for the sake of clarity, the whole device including the Wien filter 100 and the second field-isolating measure is named as 300, the field-terminating plates 61 and 62 in FIG. 2(a) are respectively renamed as 71, 72, and the field-shielding plates are respectively named as 81 and 82. FIG. 3(a) is the view on the sectional plane on the plane XOZ. The field-shielding plates 81 and 82 sandwich the field-terminating plates 71 and 72 with two axial gaps which respectively can be filled with a material of weakly-magnetic conductor but most preferred vacuum or filled with a material of non-magnetic conductor. The radial outer dimensions of plates 81 and 82 are preferred to be configured equal to or larger than that of the field-terminating plates and tube 71, 72 and 63.

Figure 3B:
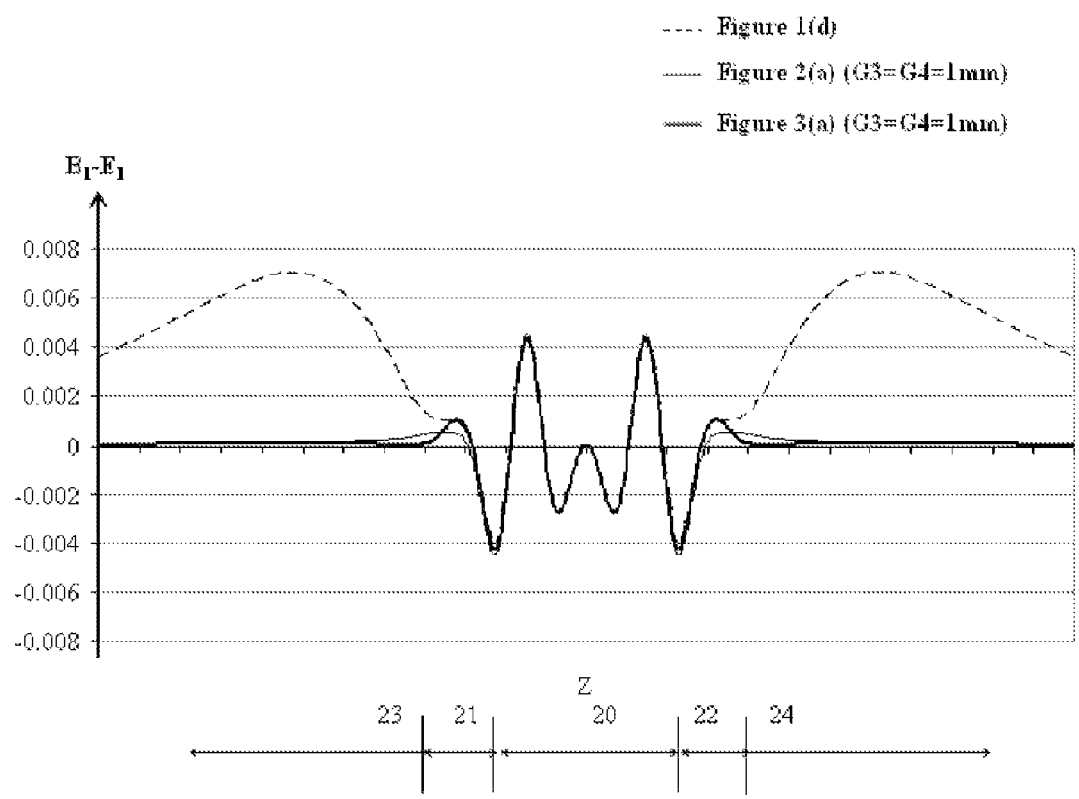
FIG. 3(b) shows a reduction of the fields-mismatch in the far fringe areas of the Wien filter along the optical axis shown in FIG. 3(a).

The reduction of the fields-mismatch in the second embodiment is shown in FIG. 3(b) in comparison with the fields-mismatch shown in FIG. 1(e) and FIG. 2(b). For the sake of comparison, all the sum dimensions of the field-terminating plate 71 and the field-shielding plate 81 and the gap between them in FIG. 3(a) are equal to the field-terminating plate 61 in FIG. 2(a) in geometry, and all the sum dimensions of the field-terminating plate 72 and the field-shielding plate 82 and the gap between them in FIG. 3(a) are equal to the field-terminating plate 62 in FIG. 2(a) in geometry. In addition, the plates 71, 72, 81, 82 and the tube 63 have the same permeability equal to 10000 and all the axial gaps have the same permeability equal to 1. In FIG. 3(b), the slim dash line is also the slim dash line in FIG. 1(d), the slim solid line is the bold line in FIG. 2(b), and the fields-mismatch of FIG. 3(a) on the foregoing conditions is in the bold solid line. The addition of the field-shielding plates 81 and 82 makes the electric and magnetic dipole fields leaking out of the Wien filter vanish away more rapidly as far from the Wien filter, consequently further reducing the fields-mismatch in the far fringe areas 23 and 24.

Figure 4A:
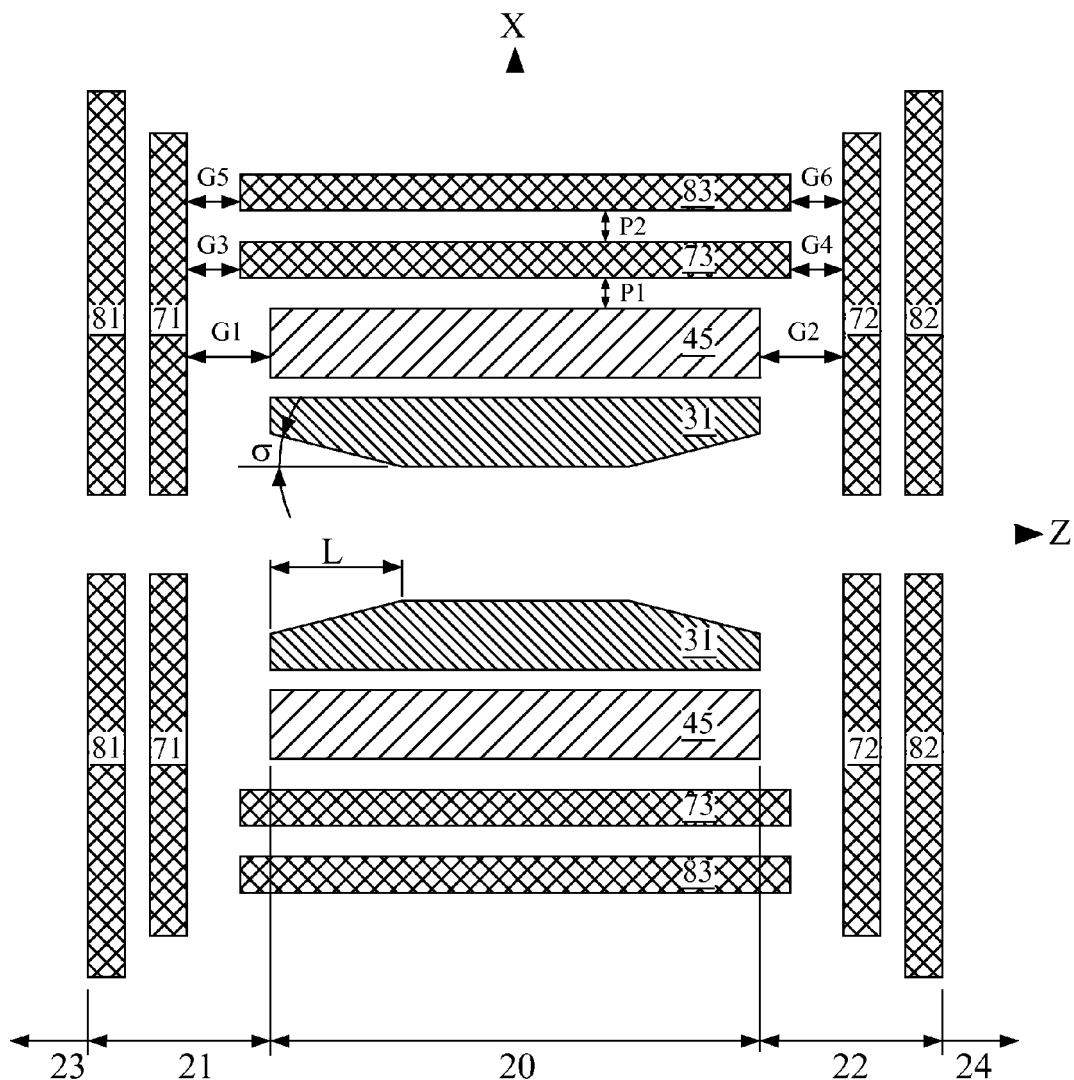
FIGS. 4(a)~4(c) respectively are schematic illustrations of the Wien Filter shown in FIGS. 1(a)~1(c) and three embodiments of a field-isolating device in accordance with a third embodiment of the present invention.
Figure 4B:
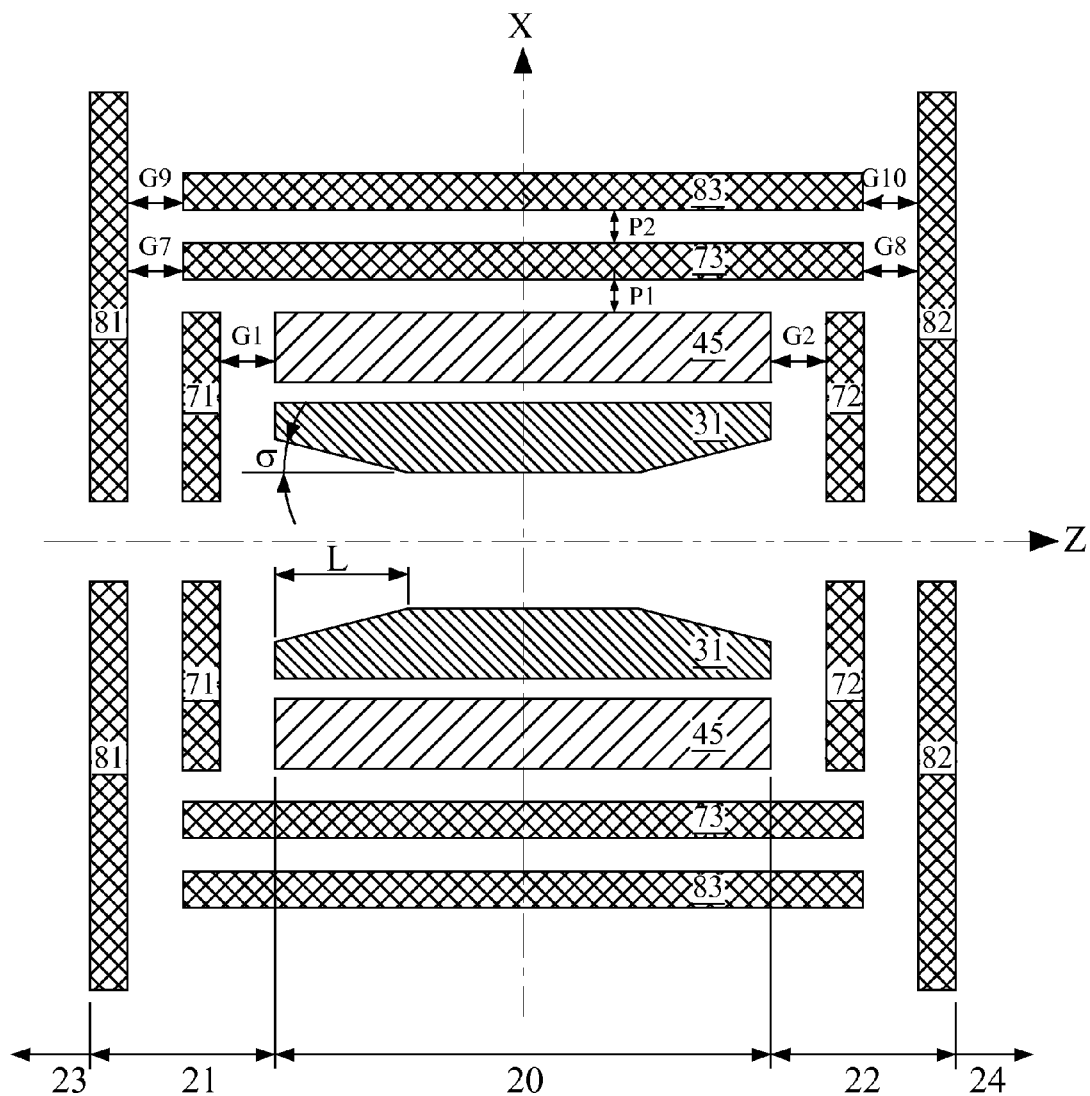
Figure 4C:
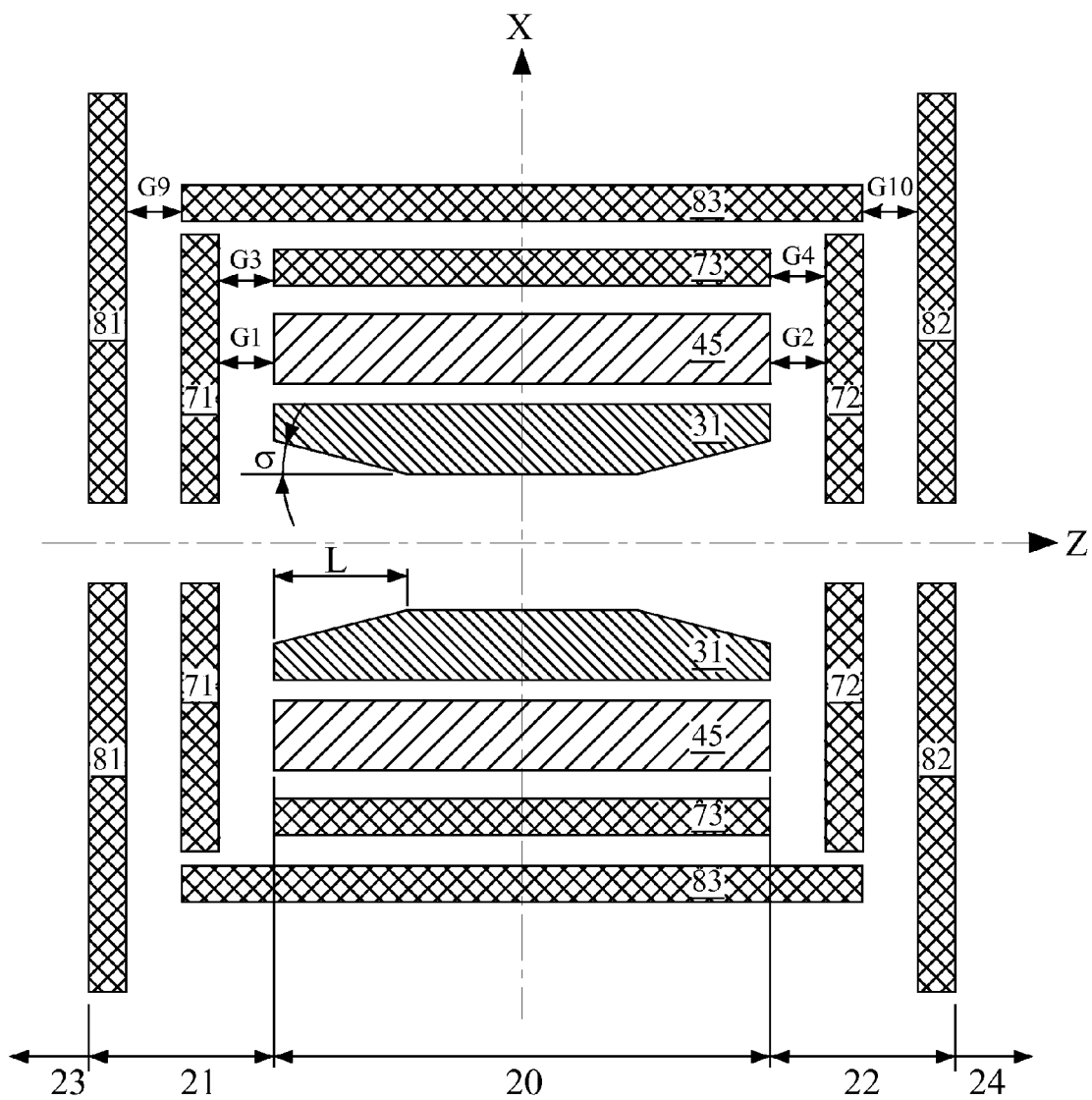

The third field-isolating measure comprises the second field-isolating measure and one field-shielding tube. The field-shielding tube is made of a material of magnetic conductor, in parallel to the optical axis of the Wien filter, and encompasses the field-terminating tube with a radial gap. The radial gap can be filled with a material of weakly-magnetic conductor but most preferred vacuum or filled with a material of non-magnetic conductor. The radial outer dimensions of the field-shielding tube are preferred equal to or smaller than the radial outer dimensions of two field-shielding plates. As the third embodiment of the invention, three layouts of the combination of the two field-terminating plates, one field-terminating tube, two field-shielding plates and one field-shielding tube are shown in FIGS. 4(a)–4(c) respectively. For the sake of clarity, in FIGS. 4(a)–4(c), the whole device including the Wien filter 100 and one of the three layouts of the third field-isolating measure is named as 410, 420 and 430, the field-terminating tube 63 in FIG. 3(a) is renamed as 73, and the field-shielding tube is named 83. The field-shielding tube 83 is made of a material of magnetic conductor, in parallel to the optical axis on Z-axis, and encompasses the field-terminating tube 73 with a radial gap P2. The radial gap P2 can be filled with a material of weakly-magnetic conductor but most preferred vacuum or filled with a material of non-magnetic conductor. The radial outer dimensions of the field-shielding tube 83 are preferred equal to or smaller than that of the field-shielding plates 81 and 82.

In FIG. 4(a), the field-terminating plates 71 and 72 sandwich the magnetic core 45 with two axial gaps G1 and G2, the field-terminating tube 73 with two axial gaps G3 and G4 and the field-shielding tube 83 with two axial gaps G5 and G6. The axial gaps G3 and G4 are preferred not only equal to or smaller than the axial gaps G1 and G2 respectively, but also equal to or larger than the axial gaps G5 and G6 respectively. All the axial gaps and all the radial gaps respectively can be filled with a material of weakly-magnetic conductor but most preferred vacuum or filled with a material of non-magnetic conductor. Furthermore, the radial outer dimensions of the field-terminating plates 71 and 72 are preferred not only equal to or larger than that of the field-shielding tube 83, but also equal to or smaller than that of the field-shielding plates 81 and 82.

Figure 5A:
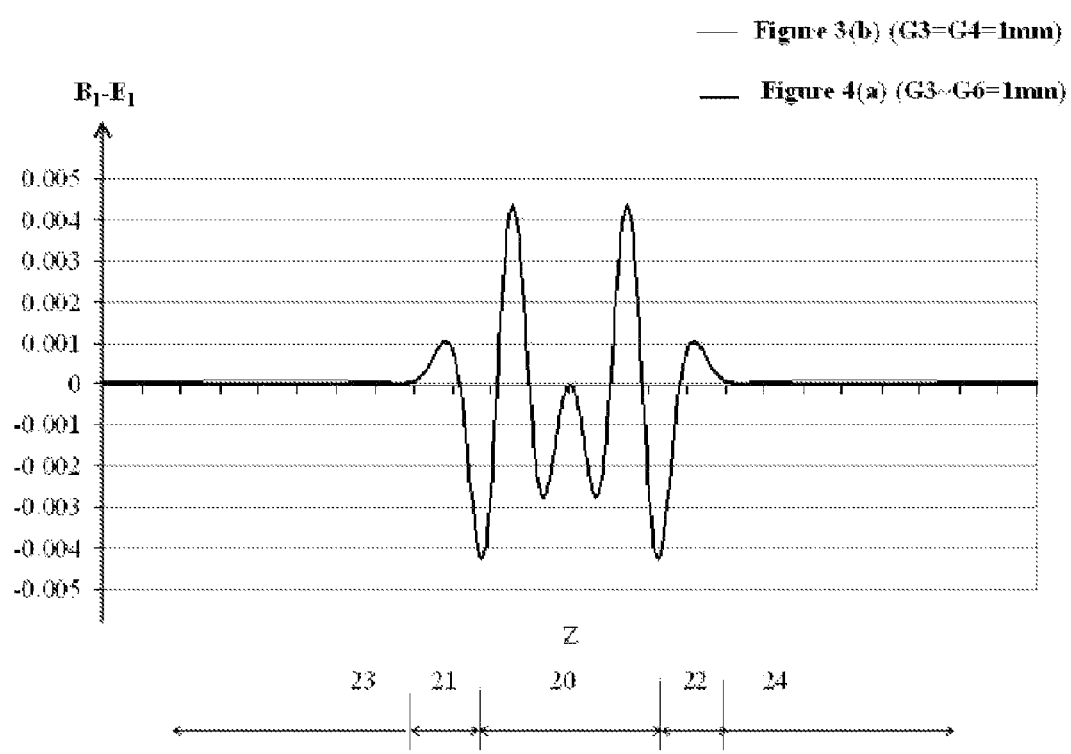
FIG. 5(a) and FIG. 5(b) shows a reduction of the fields-mismatch in the far fringe areas of the Wien filter along the optical axis and the embodiment of the field-isolating device shown in FIG. 4(a).
Figure 5B:
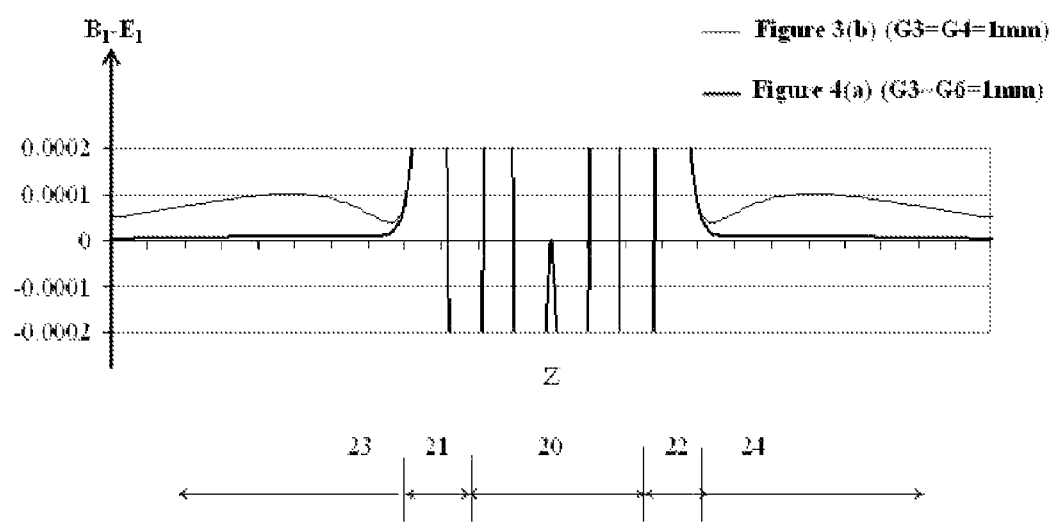

FIG. 5(a) and FIG. 5(b) show the reduction of the fields-mismatch in the layout of the third embodiment shown in FIG. 4(a), in comparison with the fields-mismatch in the second embodiment shown in FIG. 3(b). For the sake of comparison, all the sum dimensions of the field-terminating tube 73 and the field-shielding tube 83 and the gap P2 between them in FIG. 4(a) are equal to the field-terminating tube 63 in FIG. 3(a) in geometry. All of the plates and tubes 71, 72, 81, 82, 73 and 83 have the same permeability equal to 10000, and all the axial gaps and all the radial gaps have the same permeability equal to 1. FIG. 5(a) and FIG. 5(b) show the same curves in different scales in order to show the effect of the field-shielding tube 83 clearly. In FIG. 5(a) and FIG. 5(b), the slim solid line is the bold solid line in FIG. 3(b), and the bold solid line is the fields-mismatch in the layout of the third embodiment shown in FIG. 4(a) on the foregoing conditions. Obviously, the addition of the field-shielding tube 83 makes the magnetic dipole field leaking out of the Wien filter vanish away much more rapidly, thereby helping to almost eliminate the fields-mismatch in the far fringe area 23 and 24.

In FIG. 4(b), the field-terminating tube 73 encloses the field-terminating plates 71 and 72 with two radial gaps, while the field-shielding plates 81 and 82 sandwich the field-terminating tube 73 and the field-shielding tube 83 with two axial gaps respectively. The axial gaps G7 and G8 on two end sides of the field-terminating tube 73 are preferred not only equal to or larger than the axial gaps G9 and G10 on two end sides of the field-shielding tube 83 respectively, but also equal to or smaller than the axial gap between plates 71 and 81 and the axial gap between plates 72 and 82 respectively. All the radial gaps and all the axial gaps respectively can be filled with a material of weakly-magnetic conductor but most preferred vacuum or filled with a material of non-magnetic conductor.

In FIG. 4(c), the field-shielding tube 83 encloses the field-terminating plates 71 and 72 with two radial gaps and is sandwiched by the field-shielding plates 81 and 82 with two axial gaps G9 and G10, while the field-terminating plates 71 and 72 sandwich the magnetic core 45 with two axial gaps G1 and G2 and the field-terminating tube 73 with two axial gaps G3 and G4. The axial gaps G3 and G4 are preferred equal to or smaller than the axial gaps G1 and G2 respectively. The axial gaps G9 and G10 are preferred equal to or smaller than the axial gap between the plates 71 and 81 and the axial gap between the plates 72 and 82 respectively. All the axial gaps and all the radial gaps respectively can be filled with a material of weakly-magnetic conductor but most preferred vacuum or filled with a material of non-magnetic conductor. Furthermore, the outer radial dimensions of the field-terminating plates 71 and 72 are preferred equal to or larger than that of the field-terminating tube 73.

To further reduce the fields-mismatch in main area 20 and two near fringe areas 21 and 22 as shown in FIG. 5(a), on the one hand, the combination of the conical angle σ and length L shown in FIG. 1(b) can be further optimized. On the other hand, other ways to modify one or both of the distribution shapes of the on-axis electric and magnetic dipole fields $E_1$ and $B_1$ on the basis of the Wien filter 100 are provided in this invention. As being explained in the cross-reference, the effective ways to reduce the fields-mismatch will be weakening the electric dipole field at the two end portions of the electric device 30 along the optical axis, or enhancing the magnetic dipole field at the two end portions of the magnetic device 40 along the optical axis, or doing both in combination. Several embodiments of the corresponding ways are shown in FIG. 6(a)~6(d), FIG. 7(a), FIG. 7(b) and FIG. 8. For the sake of brevity and simplicity of demonstration, only the cylinder 31 formed by the twelve electrodes e1~e12 of the electric device 30 and the magnetic core 45 of the magnetic device 40 are shown in these figures.

Figure 6A:
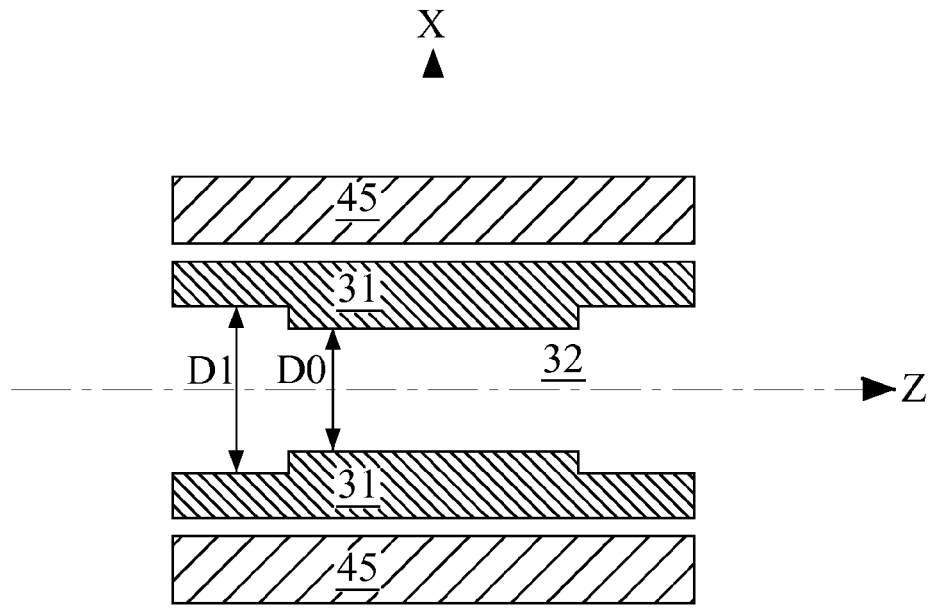
FIGS. 6(a)~6(d) respectively are schematic illustrations of embodiments of a Wien Filter in accordance with a fourth embodiment of the present invention.
Figure 6B:
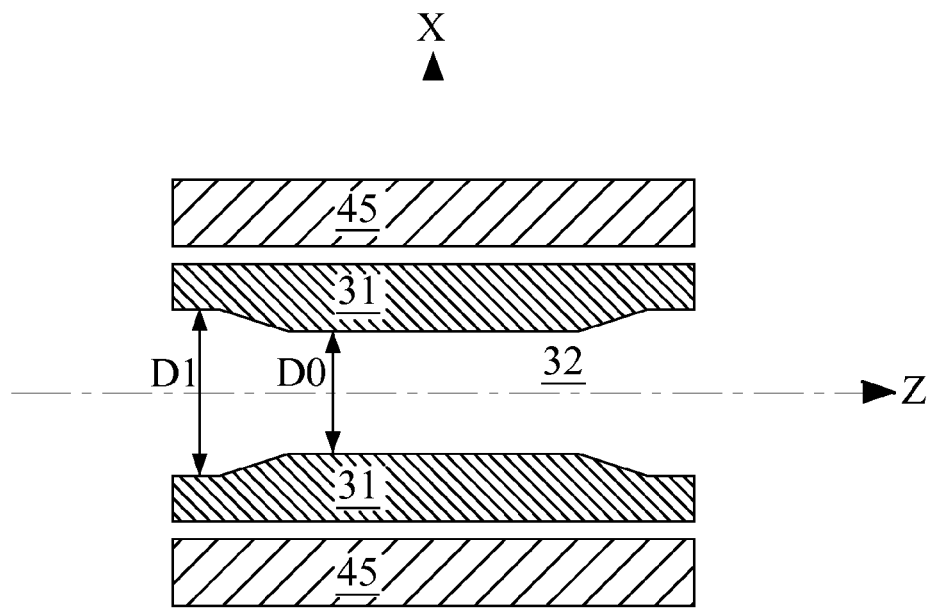
Figure 6C:
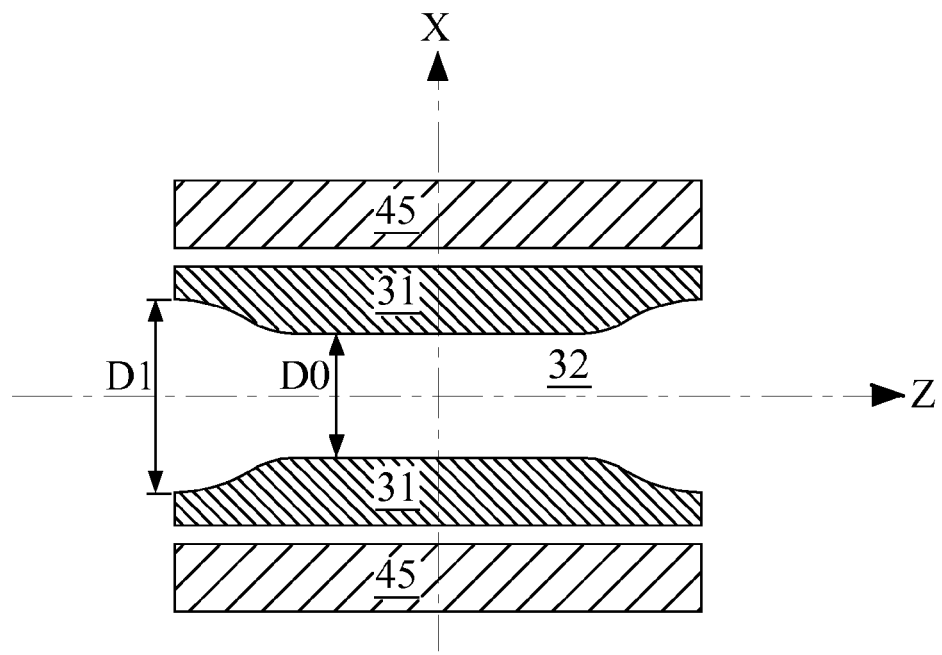
Figure 6D:
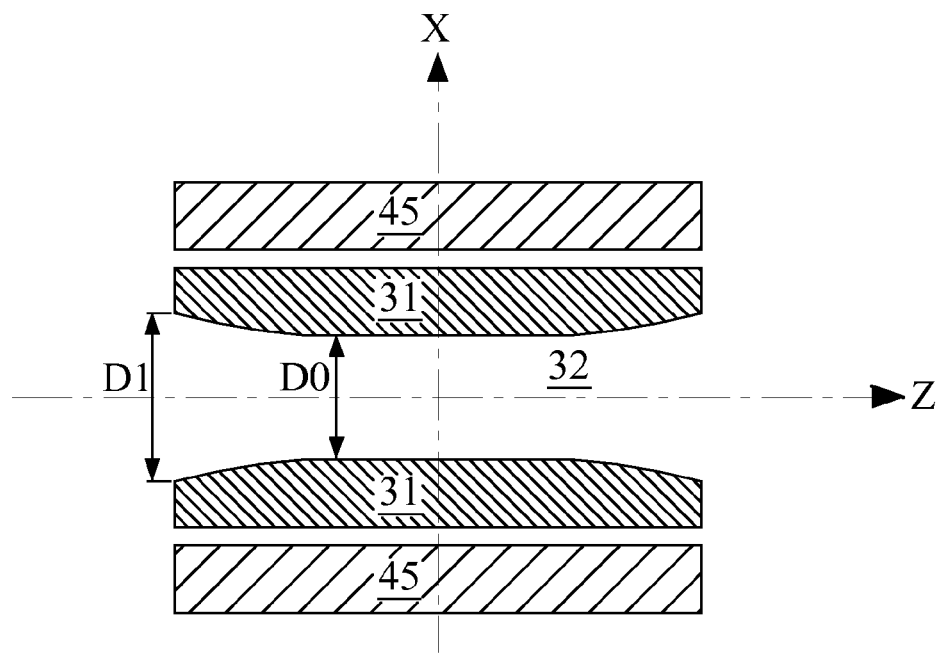

At first, four embodiments which weaken the electric dipole field at the two end portions of the cylindrical through hole 32 of the cylinder 31 are shown in FIGS. 6(a)~6(d) respectively as the fourth embodiment of the invention. In FIGS. 6(a)~6(d), the cylindrical through hole 32 is configured to comprise a cylindrical central portion and two axisymmetric end portions which are coaxial with the central portion. In FIG. 6(a), each end portion is cylindrical and has a diameter D1 larger than the diameter D0 of the central portion. In FIG. 6(b), each end portion comprise a cylindrical part and a conical part, wherein both parts are coaxial with the central portion, the conical part is adjacent to the cylindrical central portion, and the cylindrical part has a diameter D1 larger than the diameter D0 of the central portion. In FIGS. 6(c) and 6(d), the sidewall of each end portion has an axisymmetrically-curved shape, and has a diameter decreasing non-linearly from the diameter D1 on the end surface of the cylinder 31 to the diameter D0 of the central portion.

Figure 7A:
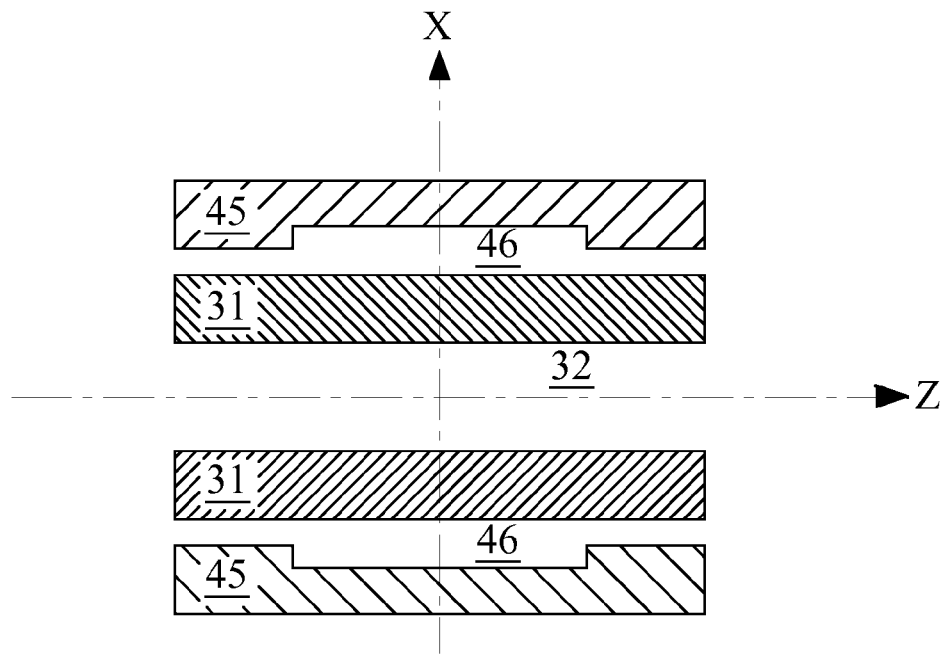
FIG. 7(a) and FIG. 7(b) respectively schematic illustrations of embodiments of a Wien Filter in accordance with a fifth embodiment of the present invention.
Figure 7B:
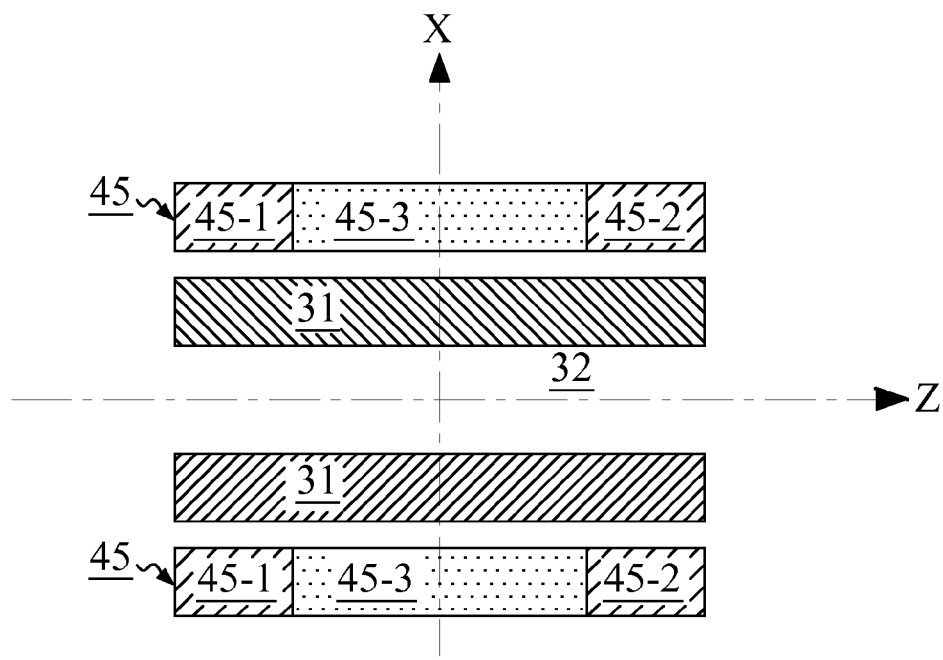

Secondly, two embodiments which enhance the magnetic dipole field at the two end portions of the magnetic device 40 are shown in FIG. 7(a) and FIG. 7(b) respectively as the fifth embodiment of this invention. In FIG. 7(a), the cylindrical through hole 46 are configured to have one cylindrical central portion and two cylindrical end portions which are coaxial with the central portion. Each of the two end portions has a diameter smaller than the diameter of the central portion. In FIG. 7(b), the magnetic core 45 is configured to comprise three cylindrical parts which are coaxial and have the same inner diameter. The central part 45-3 has a permeability which is much lower than that of the two end parts 45-1 and 45-2. Although the inner diameters of three parts 45-1, 45-2 and 45-3 in FIG. 7(b) are equal, they can be unequal to each other. Furthermore, each of the two end parts 45-1 and 45-2 is preferred to have an inner diameter equal to or smaller than that of the central part 45-3.

Figure 8:
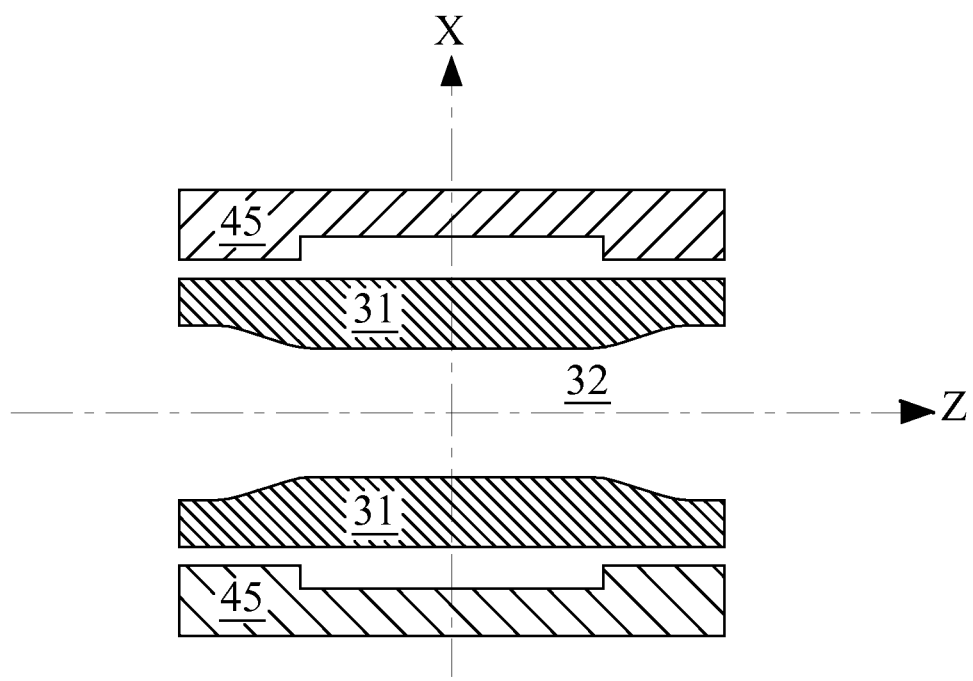
FIG. 8 shows a schematic illustration of one embodiment of a Wien Filter in accordance with a sixth embodiment of the present invention.

The foregoing ways to weaken the electric dipole field $E_1$ at two ends of the electric device 30 and enhance the magnetic dipole field $B_1$ at the two ends of the magnetic device 40 can be combined. The combination is as the sixth embodiment of this invention. One type of the combination is shown in FIG. 8, which combines the ways shown in FIG. 6(b) and FIG. 7(a).

Although in all of the embodiments the cylinder 31 and the magnetic core 45 are shown to have the same length, both can have unequal lengths and the length of the cylinder 31 is preferred equal to or shorter than that of the magnetic core 45.

As is well known, a Wien filter is required to work on Wien Condition. Wien Condition actually requires the on-axis electric and magnetic dipole fields are same in field distribution shape, or simply saying the two fields match each other in field distribution shape. Accordingly, at first this invention provides several field-isolating measures for reducing the fields-mismatch in the far fringe areas of a Wien filter, each of which specially forms a magnetic circuit to cover the magnetic deflector in a Wien filter so as to suppress the magnetic flux leaking out of the Wien filter as much as possible. Because the field-isolating measures can eliminate the adverse impact on imaging quality due to the electric and magnetic fields leaking out of the Wien filter, they are especially useful for the Wien filter used in an imaging system with high resolution, such as SEM. Then this invention provides several designs of Wien filter on the basis of the Wien filter proposed in the cross-reference, so as to provide more flexibility to meet the Wien Condition as much as possible within the Wien filter. The designs can weaken the electric dipole field at the two end portions of the electric device, or enhance the magnetic dipole field at the two end portions of the magnetic device, or even do the both in combination. The designs have compact and efficient structures, which are also especially useful for the applications in an imaging system with high resolution, such as SEM. In addition, the designs make it possible to construct a desired Wien filter at a reasonable manufacturing cost.

Although the present invention has been explained in relation to its preferred embodiment, it is to be understood that other modifications and variation can be made without departing the spirit and scope of the invention as hereafter claimed.

What is claimed is:

1. A field-isolating device for a Wien filter, comprising:
two field-terminating plates being perpendicular to an optical axis of the Wien filter and sandwiching the Wien filter with two axial gaps, wherein each of the two field-terminating plates is made of a material of both electric and magnetic conductor and has an opening aligned with the optical axis of the Wien filter and for particles passing through; and
a field-terminating tube being parallel to the optical axis of the Wien filter and enclosing the Wien filter with a radial gap, wherein said tube is made of a material of magnetic conductor,
wherein said two field-terminating plates and field-terminating tube are configured to make an electric dipole field and a magnetic dipole field leaking out of the Wien filter vanish away rapidly outside the field-isolating device.

2. The field-isolating device according to claim 1, further comprising two field-shielding plates being perpendicular to the optical axis of the Wien filter and sandwiching the two field-terminating plates with two axial gaps, wherein each of the two field-shielding plates is made of a material of both electric and magnetic conductor and has an opening aligned with the optical axis of the Wien filter and for particles passing through, and said two field-terminating plates, field-terminating tube and two field-shielding plates together are configured to make the electric dipole field and magnetic dipole field leaking out of the Wien filter vanish away more rapidly outside the field-isolating device.

3. The field-isolating device according to claim 2, further comprising a field-shielding tube being parallel to the optical axis of the Wien filter and enclosing the field-terminating tube with a radial gap, wherein the field-shielding tube is made of a material of magnetic conductor, and said two field-terminating plates, field-terminating tube, two field-shielding plates, and field-shielding tube are configured to make the electric dipole field and magnetic dipole field leaking out of the Wien filter vanish away much more rapidly outside the field-isolating device.

4. The field-isolating device according to claim 3, wherein the two field-terminating plates and the two field-shielding plates are configured and set at a potential so as not to generate acceleration or deceleration field along the optical axis of the Wien filter inside the field-isolating device.

5. The field-isolating device according to claim 4, wherein radial outer dimensions of said two field-shielding plates are equal to or larger than radial outer dimensions of said two field-terminating plates and field-shielding tube, and dimensions of the openings of said two field-terminating plates and two field-shielding plates are equal to or smaller than radial inner dimensions of the Wien filter.

6. The field-isolating device according to claim 5, wherein a first gap is between said field-terminating tube and each of said two field-terminating plates.

7. The field-isolating device according to claim 6, wherein a second gap is between said field-shielding tube and each of said two field-terminating plates.

8. The field-isolating device according to claim 6, wherein an axial gap is between said field-shielding tube and each of said two field-shielding plates.

9. An electric device, comprising:
twelve electrodes, inner ends of said twelve electrodes configuring a cylindrical through hole and an 8-fold symmetry, twelve through slits separating the twelve electrodes respectively and parallel to a central axis of said hole, said central axis being an optical axis of the electric device, wherein said twelve electrodes are excited to generate an electric dipole field in a direction perpendicular to the optical axis; and
two electric field-terminating plates being perpendicular to the optical axis and sandwiching the twelve electrodes with two axial gaps, such that the electric dipole field along the optical axis of the electric device vanishes away rapidly outside the electric device, wherein each of the two electric field-terminating plates is made of a material of electric conductor, and has an opening aligned with the optical axis of the electric device and for particles passing through,
wherein each of said twelve through slits has a central plane containing the optical axis,
wherein a $1^{st}$ electrode, a $2^{nd}$ electrode, a $3^{rd}$ electrode, a $4^{th}$ electrode, a $5^{th}$ electrode, a $6^{th}$ electrode, a $7^{th}$ electrode, an $8^{th}$ electrode, a $9^{th}$ electrode, a $10^{th}$ electrode, an $11^{th}$ electrode, and a $12^{th}$ electrode of the twelve electrodes are configured in a rotation sequence,
wherein the 8-fold symmetry has four planes of symmetry, a first and a third planes of symmetry of the four planes of symmetry are perpendicular to each other, a second and a fourth planes of symmetry of the four planes of symmetry are perpendicular to each other, an angle between the first and the second planes of symmetry is 45°, and each of said four planes contains the optical axis,
wherein the first plane of symmetry bisects the inner ends of the $1^{st}$ and $7^{th}$ electrodes, the second plane of symmetry bisects the through slit between the $2^{nd}$ and $3^{rd}$ electrodes and the through slit between the $8^{th}$ and $9^{th}$ electrodes, the third plane of symmetry bisects the inner ends of the $4^{th}$ and $10^{th}$ electrodes, and the fourth plane of symmetry bisects the through slit between the $5^{th}$ and $6^{th}$ electrodes and the through slit between the $11^{th}$ and $12^{th}$ electrodes.

10. The electric device according to claim 9, wherein an angle between the first plane of symmetry and the central plane of the through slit between the $1^{st}$ and $2^{nd}$ electrodes is about 25°.

11. The electric device according to claim 10, wherein arc angles of inner sides of said twelve through slits, in any sectional plane perpendicular to the optical axis, are equal to each other and about 3°.

12. The electric device according to claim 9, wherein
the $5^{th}$, $7^{th}$, and $9^{th}$ electrodes are set at a first potential;
the $1^{st}$, $3^{rd}$, and $11^{th}$ electrodes are set at a second potential;
the $8^{th}$, $10^{th}$, and $12^{th}$ electrodes are set at a third potential; and
the $2^{nd}$, $4^{th}$ and $6^{th}$ electrodes are set at a fourth potential,
an average of the first and second potentials is equal to an average of the third and fourth potentials,
wherein the two electric field-terminating plates are set at the average potential of the first and second potentials.

13. The electric device according to claim 12, wherein potentials of the $1^{st}$, $2^{nd}$, $6^{th}$, $7^{th}$, $8^{th}$, and $12^{th}$ electrodes are changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

14. The electric device according to claim 9, wherein outer radial dimensions of said electrodes are equal to or small than outer radial dimensions of the two electric field-terminating plates, and a diameter of the cylindrical through hole is equal to or larger than radial dimensions of the openings.

15. A magnetic device, comprising:
a cylindrical magnetic core with a cylindrical through hole, a central axis of said hole being an optical axis of said magnetic device;
four coils respectively winding around an inner and an outer sidewalls of said magnetic core and parallel to the optical axis, wherein said four coils are excited to generate a magnetic dipole filed in a direction perpendicular to the optical axis; and
two magnetic field-terminating plates being perpendicular to the optical axis of the magnetic device and sandwiching the cylindrical magnetic core with two axial gaps, such that the magnetic dipole field along the optical axis of the magnetic device vanishes away rapidly outside the magnetic device, wherein each of the two magnetic field-terminating plates is made of a material of magnetic conductor, and has an opening aligned with the optical axis of the magnetic device and for particles passing through,
wherein a $1^{st}$ coil, a $2^{nd}$ coil, a $3^{rd}$ coil, and a $4^{th}$ coil of said four coils are configured in a rotation sequence, the $1^{st}$ and $3^{rd}$ coils are bisected by a common central plane and the $2^{nd}$ and $4^{th}$ coils are bisected by the other common central plane, and both of the two common central planes contain the optical axis,
wherein a first and a second planes respectively bisect two adjacent angles between the two common central planes, a first and a second directions are both perpendicular to the optical axis and respectively parallel to the first and the second planes.

16. The magnetic device according to claim 15, wherein the cylindrical through hole is coaxial with an outline of the cylindrical magnetic core.

17. The magnetic device according to claim 16, wherein one of the two adjacent angles between said two common central planes is about 120°.

18. The magnetic device according to claim 17, wherein magnetomotive forces of said four coils are equal in magnitude and the electric current directions thereof are symmetric about the first plane and anti-symmetric about the second plane.

19. The magnetic device according to claim 18, wherein an outer diameter of the magnetic core is equal to or small than outer radial dimensions of the two magnetic field-terminating plates, and a diameter of the cylindrical through hole is equal to or larger than the radial dimensions of the openings.

20. The magnetic device according to claim 15, further comprising a magnetic field-terminating tube being parallel to the optical axis and enclosing the magnetic core with a radial gap, such that the magnetic dipole field along the optical axis of the magnetic device vanishes away more rapidly outside the magnetic device, wherein the tube is made of a material of magnetic conductor.

21. A Wien filter, comprising:
a magnetic device according to claim 15; and
an electric device including:
twelve electrodes, inner ends of said twelve electrodes configuring a cylindrical through hole and an 8-fold symmetry, twelve through slits separating the twelve electrodes respectively and parallel to a central axis of said hole, said central axis being an optical axis of the electric device, wherein said twelve electrodes are excited to generate an electric dipole field in a direction perpendicular to the optical axis; and
two electric field-terminating plates being perpendicular to the optical axis and sandwiching the twelve electrodes with two axial gaps, such that the electric dipole field along the optical axis of the electric device vanishes away rapidly outside the electric device, wherein each of the two electric field-terminating plates is made of a material of electric conductor, and has an opening aligned with the optical axis of the electric device and for particles passing through,
wherein each of said twelve through slits has a central plane containing the optical axis,
wherein a $1^{st}$ electrode, a $2^{nd}$ electrode, a $3^{rd}$ electrode, a $4^{th}$ electrode, a $5^{th}$ electrode, a $6^{th}$ electrode, a $7^{th}$ electrode, an $8^{th}$ electrode, a $9^{th}$ electrode, a $10^{th}$ electrode, an $11^{th}$ electrode, and a $12^{th}$ electrode of the twelve electrodes are configured in a rotation sequence,
wherein the 8-fold symmetry has four planes of symmetry, a first and a third planes of symmetry of the four planes of symmetry are perpendicular to each other, a second and a fourth planes of symmetry of the four planes of symmetry are perpendicular to each other, an angle between the first and the second planes of symmetry is 45°, and each of said four planes contains the optical axis,
wherein the first plane of symmetry bisects the inner ends of the $1^{st}$ and $7^{th}$ electrodes, the second plane of symmetry bisects the through slit between the $2^{nd}$ and $3^{rd}$ electrodes and the through slit between the $8^{th}$ and $9^{th}$ electrodes, the third plane of symmetry bisects the inner ends of the $4^{th}$ and $10^{th}$ electrodes, and the fourth plane of symmetry bisects the through slit between the $5^{th}$ and $6^{th}$ electrodes and the through slit between the $11^{th}$ and $12^{th}$ electrodes,
wherein the twelve electrodes of the electric device are inside the cylindrical through hole of the magnetic core of the magnetic device,
wherein the optical axis of the electric device, coincident with the optical axis of the magnetic device, is an optical axis of the Wien filter, and the first and the second directions of the magnetic device are a first and a second directions of said Wien filter respectively,
wherein the electric device generates an electric dipole field in the first direction of said Wien filter, and the magnetic device generates a magnetic dipole field in the second direction of said Wien filter.

22. The Wien filter according to claim 21, wherein the electric field-terminating plate of the electric device and the magnetic field-terminating plate of the magnetic device on the same side of the Wien filter are a same field-terminating plate which is made of a material of both electric and magnetic conductor.

23. The Wien filter according to claim 22, wherein an outline of the twelve electrodes of the electric device is cylindrical and coaxial with the cylindrical through hole thereof and an outline of the cylindrical magnetic core of the magnetic device is coaxial with the cylindrical through hole thereof.

24. The Wien filter according to claim 23, wherein the first plane of symmetry in the electric device coincides with the first plane of the magnetic device.

25. The Wien filter according to claim 24, wherein
the $5^{th}$, $7^{th}$, and $9^{th}$ electrodes are set at a first potential;
the $1^{st}$, $3^{rd}$, and $11^{th}$ electrodes are set at a second potential;
the $8^{th}$, $10^{th}$, $12^{th}$, $2^{nd}$, $4^{th}$, $6^{th}$ electrodes and two field-terminating plates are set at an average potential of the first and second potentials,
wherein the average of the first and second potentials is equal to zero potential,
wherein potentials of the $1^{st}$, $2^{nd}$, $6^{th}$, $7^{th}$, $8^{th}$, and $12^{th}$ electrodes are changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

26. The Wien filter according to claim 25, wherein for the magnetic device, the angle between the two common central planes and bisected by the second plane is about 120°, and the magnetomotive forces of the four coils are equal in magnitude and the electric current directions thereof are symmetric about the first plane and anti-symmetric about the second plane; for the electric device, the angle between the first plane of symmetry and the central plane of the through slit between the $1^{st}$ and $2^{nd}$ electrodes is about 25°, and arc angles of inner sides of the twelve through slits in any sectional plane perpendicular to the optical axis are equal to each other and about 3°.

27. The Wien filter according to claim 25, wherein a diameter of the cylindrical through hole of the electric device is smaller at a central portion thereof than at two end portions thereof, such that a distribution shape of the electric dipole field can match a distribution shape of the magnetic dipole field along the optical axis of the Wien filter.

28. The Wien filter according to claim 25, wherein a diameter of the cylindrical through hole of the magnetic device is larger at a central portion thereof than at two end portions thereof, such that a distribution shape of the magnetic dipole field can match a distribution shape of the electric dipole field along the optical axis of the Wien filter.

29. The Wien filter according to claim 25, wherein a permeability of the magnetic core of the magnetic device is smaller at a central portion thereof than at two end portions thereof, such that a distribution shape of the magnetic dipole field can match a distribution shape of the electric dipole field along the optical axis of the Wien filter.

30. The Wien filter according to claim 27, wherein each of two end portions of the cylindrical through hole of the electric device has a portion of conical shape coaxial with a cylindrical central portion of said through hole, such that the distribution shape of the electric dipole field can match the distribution shape of the magnetic dipole field along the optical axis of the Wien filter.

31. The Wien filter according to claim 22, wherein an outer diameter of the magnetic core of the magnetic device is equal to or small than outer radial dimensions of the two field-terminating plates, and the diameter of the cylindrical through hole of the electric device is equal to or larger than radial dimensions of the openings of the two field-terminating plates.

32. The Wien filter according to claim 31, further comprising a field-terminating tube being parallel to the optical axis of the Wien filter and enclosing the magnetic core of the magnetic device with a radial gap, such that the magnetic dipole field along the optical axis of the Wien filter vanishes away more rapidly outside the Wien filter, wherein the tube is made of a material of magnetic conductor.

33. The Wien filter according to claim 32, further comprising two field-shielding plates being perpendicular to the optical axis of the Wien filter and sandwiching the two field-terminating plates with two axial gaps, such that the electric and magnetic dipole fields along the optical axis of the Wien filter vanish away more rapidly outside the Wien filter, wherein each of the two field-shielding plates is made of a material of both electric and magnetic conductor, and has an opening aligned with the optical axis of the Wien filter and for particles passing through.

34. The Wien filter according to claim 33, further comprising a field-shielding tube being parallel to the optical axis of the Wien filter and enclosing the field-terminating tube with a radial gap, such that the magnetic dipole field along the optical axis of the Wien filter vanishes away more rapidly outside the Wien filter, wherein the tube is made of a material of magnetic conductor.

35. A Wien filter, comprising:
a cylindrical magnetic device including:
  a cylindrical magnetic core with a first coaxial-cylindrical through hole, a central axis thereof being an optical axis of said magnetic device and the Wien filter; and
  four coils respectively winding around an inner and an outer sidewalls of said magnetic core and parallel to the optical axis, said four coils configuring a 4-fold symmetry in any sectional plane perpendicular to the optical axis such that a magnetic dipole field can be generated within the magnetic device in a direction perpendicular to the optical axis;
a cylindrical electric device including twelve electrodes, said twelve electrodes configuring a cylinder with a second coaxial-cylindrical through hole and being inside the first through hole of the magnetic core of the cylindrical magnetic device, a central axis of said second hole being an optical axis of the electric device and coincident with the optical axis of the Wien filter, said twelve electrodes configuring an 8-fold symmetry and being sectorial in said any sectional plane perpendicular to the optical axis, twelve through slits separating said twelve electrodes respectively and parallel to the optical axis, each of said twelve through slits having a central plane containing the optical axis, wherein said twelve electrodes are excited to generate one electric dipole field within the electric device in a direction perpendicular to the optical axis of the Wien filter and the magnetic dipole field;
two field-terminating plates being perpendicular to the optical axis of the Wien filter and sandwiching the magnetic device and the electric device with two axial gaps respectively, such that the electric dipole field and the magnetic dipole field along the optical axis of the Wien filter vanish away rapidly outside the Wien filter, wherein each of the two field-terminating plates is made of a material of both electric and magnetic conductor, and has an opening aligned with the optical axis of the Wien filter and for particles passing through; and
a field-terminating tube being parallel to the optical axis of the Wien filter and enclosing the magnetic device with a radial gap, such that the magnetic dipole field along the optical axis of the Wien filter vanishes away more rapidly outside the Wien filter, wherein the tube is made of a material of magnetic conductor.

36. The Wien filter according to claim 35, wherein each of two end portions of the second coaxial-cylindrical through hole of the electric device has a portion of conical shape coaxial with a cylindrical central portion of said second hole, such that a distribution shape of the electric dipole field can match a distribution shape of the magnetic dipole field along the optical axis of the Wien filter.

37. The Wien filter according to claim 36, further comprising two field-shielding plates being perpendicular to the optical axis of the Wien filter and sandwiching the two field-terminating plates with two axial gaps, such that the electric dipole field and the magnetic dipole field along the optical axis of the Wien filter vanish away more rapidly outside the Wien filter, wherein each of the two field-shielding plates is made of a material of both electric and magnetic conductor, and has an opening aligned with the optical axis of the Wien filter and for particles passing through.

38. The Wien filter according to claim 37, further comprising a field-shielding tube being parallel to the optical axis of the Wien filter and enclosing the field-terminating tube with a radial gap, such that the magnetic dipole field along the optical axis of the Wien filter vanishes away more rapidly outside the Wien filter, wherein the tube is made of a material of magnetic conductor.

39. A Wien filter, comprising:
an electric device generating an electric dipole field in a direction perpendicular to an optical axis of the Wien filter;
a magnetic device generating a magnetic dipole field in a direction perpendicular to the optical axis of the Wien filter and the electric dipole field, wherein the magnetic dipole field is superimposed onto the electric dipole field;
two field-terminating plates being perpendicular to the optical axis of the Wien filter and sandwiching the electric device and the magnetic device with two axial gaps respectively, wherein each of the two field-terminating plates is made of a material of both electric and magnetic conductor and has an opening aligned with the optical axis of the Wien filter and for particles passing through;
a field-terminating tube being parallel to the optical axis of the Wien filter and enclosing the electric device and the magnetic device with a radial gap respectively, wherein said tube is made of a material of magnetic conductor; and two field-shielding plates being perpendicular to the optical axis of the Wien filter and sandwiching the two field-terminating plates with two axial gaps, wherein each of the two field-shielding plates is made of a material of both electric and magnetic conductor, and has an opening aligned with the optical axis of the Wien filter and for particles passing through;

wherein said two field-terminating plates, field-terminating tube, two field-shielding plates are configured to make the electric dipole field and magnetic dipole field along the optical axis of the Wien filter vanish away rapidly outside the Wien filter, wherein the two field-terminating plates and the field-shielding plates are configured and set at a potential so as not to generate acceleration or deceleration field along the optical axis of the Wien filter inside the Wien filter.

\* \* \* \* \*